US007682843B2

(12) United States Patent
Moriya et al.

(10) Patent No.: US 7,682,843 B2
(45) Date of Patent: Mar. 23, 2010

(54) SEMICONDUCTOR FABRICATION SYSTEM, AND FLOW RATE CORRECTION METHOD AND PROGRAM FOR SEMICONDUCTOR FABRICATION SYSTEM

(75) Inventors: Shuji Moriya, Nirasaki (JP); Tsuneyuki Okabe, Nirasaki (JP); Hiroyuki Ebi, Kyoto (JP); Tetsuo Shimizu, Kyoto (JP); Hitoshi Kitagawa, Kyoto (JP)

(73) Assignee: Tokyo Electron Limited, Tokyo (JP)

( * ) Notice: Subject to any disclaimer, the term of this patent is extended or adjusted under 35 U.S.C. 154(b) by 79 days.

(21) Appl. No.: 11/817,104

(22) PCT Filed: Jun. 28, 2006

(86) PCT No.: PCT/JP2006/312863

§ 371 (c)(1),
(2), (4) Date: Sep. 5, 2007

(87) PCT Pub. No.: WO2007/023614

PCT Pub. Date: Mar. 1, 2007

(65) Prior Publication Data

US 2009/0061541 A1 Mar. 5, 2009

(30) Foreign Application Priority Data

Aug. 25, 2005 (JP) ............................. 2005-243970

(51) Int. Cl.
*H01L 21/66* (2006.01)
(52) U.S. Cl. .................. 438/10; 257/E21.528; 216/61; 118/690; 118/714

(58) Field of Classification Search .................. 438/10; 257/E21.528; 216/61; 118/690, 714
See application file for complete search history.

(56) References Cited

U.S. PATENT DOCUMENTS

2006/0172442 A1    8/2006  Okabe et al.
2009/0061541 A1*   3/2009  Moriya et al. .................. 438/10
(Continued)

FOREIGN PATENT DOCUMENTS

JP             63040739 A  *  2/1988
(Continued)

*Primary Examiner*—George Fourson
(74) *Attorney, Agent, or Firm*—Oblon, Spivak, McClelland, Maier & Neustadt, L.L.P.

(57) ABSTRACT

Zero point shift based on thermal siphon effect occurring actually when a substrate is processed is detected accurately and corrected suitably. The semiconductor fabrication system comprises a gas supply passage (210) for supplying gas into a heat treatment unit (110), an MFC (240) for comparing an output voltage from a detecting unit for detecting the gas flow rate of the gas supply passage with a set voltage corresponding to a preset flow rate and controlling the gas flow rate of the gas supply passage to the set flow rate, and a control unit (300). The control unit replaces gas in the MFC by gas which is to be used at least for processing a substrate before the substrate is processed, detects the output voltage from the MFC under a state where valves (230, 250) provided in the upstream and the downstream of the MFC are closed and stores the detected output voltage in a storage unit, corrects the set voltage corresponding to the flow rate of gas to be used for processing the substrate based on the output voltage from the MFC stored in the storage unit at the time of processing the substrate, and sets the corrected set voltage in the MFC.

6 Claims, 13 Drawing Sheets

| U.S. PATENT DOCUMENTS | | | | |
|---|---|---|---|---|
| 2009/0068769 A1* | 3/2009 | Okumura et al. | ............... | 438/10 |
| 2009/0146089 A1* | 6/2009 | Moriya et al. | .................. | 251/12 |

FOREIGN PATENT DOCUMENTS

| JP | 2004-003957 | 1/2004 |
|---|---|---|
| JP | 2005-038058 | 2/2005 |
| WO | WO 2005/008350 A1 | 1/2005 |

\* cited by examiner

FIG.5

| FIRST ZERO POINT SHIFT DATA ||
|---|---|
| MFC(k) | FIRST ZERO POINT SHIFT (Ek) [mV] |
| FIRST MFC | E1 |
| SECOND MFC | E2 |
| THIRD MFC | E3 |

| | | | 384 |
|---|---|---|---|
| SECOND ZERO POINT SHIFT DATA ||||
| MFC(k) | KIND OF GAS(Gk) | PRESSURE (Pk) [MPa] | SECOND ZERO POINT SHIFT (Vk) [mV] |
| FIRST MFC | $SiH_4$ | $P1_{SiH4}$ ⋮ | $V1_{SiH4}$ ⋮ |
| | $N_2$ | $P1_{N2}$ ⋮ | $V1_{N2}$ ⋮ |
| SECOND MFC | $Si_2H_6$ | $P2_{Si2H6}$ ⋮ | $V2_{Si2H6}$ ⋮ |
| | $N_2$ | $P2_{N2}$ ⋮ | $V2_{N2}$ ⋮ |
| THIRD MFC | $SiH_2Cl_2$ | $P3_{SiH2Cl2}$ ⋮ | $V3_{SiH2Cl2}$ ⋮ |
| | $N_2$ | $P3_{N2}$ ⋮ | $V3_{N2}$ ⋮ |

FIG. 13

| FIRST ZERO POINT SHIFT DATA | |
|---|---|
| MFC(k) | FIRST ZERO POINT SHIFT (Ek) [mV] |
| FIRST MFC | E1 |

| SECOND ZERO POINT SHIFT DATA | | | |
|---|---|---|---|
| MFC(k) | KIND OF GAS(Gk) | PRESSURE (Pk) [MPa] | SECOND ZERO POINT SHIFT (Vk) [mV] |
| FIRST MFC | $SiH_4$ | $P1_{SiH4}$ ⋮ | $V1_{SiH4}$ ⋮ |
| | $Si_2H_6$ | $P2_{Si2H6}$ ⋮ | $V2_{Si2H6}$ ⋮ |
| | $SiH_2Cl_2$ | $P3_{SiH2Cl2}$ ⋮ | $V3_{SiH2Cl2}$ ⋮ |
| | $N_2$ | $P2_{N2}$ ⋮ | $V4_{N2}$ ⋮ |

SEMICONDUCTOR FABRICATION SYSTEM, AND FLOW RATE CORRECTION METHOD AND PROGRAM FOR SEMICONDUCTOR FABRICATION SYSTEM

FIELD OF THE INVENTION

The present invention relates to a semiconductor fabrication apparatus which controls a flow rate of gas or liquid by using a flow rate controller, such as a mass flow controller, and performs a specific process on a substrate; a method of correcting the flow rate; and a program therefor.

BACKGROUND OF THE INVENTION

Conventionally, in a semiconductor device manufacturing process (e.g., a film formation process using a film forming gas, an etching process using an etching gas, and the like), a gas or a liquid is supplied to a semiconductor fabrication apparatus. In this case, a flow rate of the gas or liquid is controlled by a flow rate controller such as a mass flow controller (MFC) installed in a supply flow path through which the gas or liquid is supplied.

The MFC is generally configured to split the supply flow path into a lateral flow path and a main flow path running in parallel. The lateral flow path includes an upstream sensor and a downstream sensor which respectively have heat generating resistance wires. When a fluid is flowing, heat is lost at the upstream to be cooled so that the upstream sensor detects a temperature lowered thereat, while heat is gained at the downstream to thereby be heated so that the downstream sensor detects a temperature raised thereat. As a result, a temperature difference is observed between the upstream sensor and the downstream sensor, and the flow rate in the supply flow path can be obtained by measuring the temperature difference. The MFC adjusts the flow rate in the supply flow path to be a set flow rate, by controlling an opening level of a flow rate control valve in response to outputs from the flow rate sensors.

However, while the MFC is being used, an actual flow rate (i.e., a flow rate of a gas which actually passes through the MFC) may be deviated from the set flow rate, due to contamination (caused by corrosion or remaining products) in a pipe around which the flow rate sensors are wound. For example, even when the actual flow rate is zero, a detected voltage value corresponding to the flow rate detected by the flow rate sensor is in many cases not zero, resulting in an error with slight deviation (see, e.g. Patent Document 1). The above-mentioned deviation of zero point (zero point shift) includes a case where the deviation is slowly increased in proportion to a duration of use, and a case where a change rate (slope) of an output voltage with respect to a flow rate varies (span shift). In the present application, this zero point shift will be referred to as "use-based zero point shift (a first zero point shift)".

Further, the deviation of the zero point (zero point shift) may also be caused due to, e.g., a molecular weight or pressure of a gas, depending on an installed orientation of the MFC. Due to requirements for a miniaturization of a semiconductor fabrication apparatus, a configuration of a piping system, an installation space or the like, there are cases where a lateral flow path (a part parallel to the main flow path), around which the flow rate sensors of the MFC are wound to be installed, needs to be installed in a vertical state (vertical orientation).

However, when the MFC is installed in the vertical orientation, even though no fluid flows into the supply flow path, for example, a flow may be developed due to the molecular weight or pressure of a gas caused by the temperature difference between the lateral flow path and the main flow path in the MFC. Accordingly, the deviation of the zero point (zero point shift) may occur. This effect is generally referred to as "thermal siphon effect." (For example, see Patent Document 2.) In the present application, this kind of zero point shift will be referred to as "installation arrangement-based zero point shift (a second zero point shift)", thereby distinguishing it from the use-based zero point shift (the first second zero point shift) that has been described above. When the second zero point shift occurs, the amount of an actually occurring zero point shift is obtained by adding an amount of the first zero point shift to that of the second zero point shift. In this manner, the zero point shift of the mass flow controller (MFC) may include the second zero point shift as well as the first zero point shift.

(Patent Document 1) Japanese Patent Laid-Open Application No. 2005-38058

(Patent Document 2) Japanese Patent Laid-Open Application No. H11-64060

SUMMARY OF THE INVENTION

As for the mass flow controller (MFC), when the aforementioned zero point shift, such as the first zero point shift and/or the second zero point shift, occurs, the actual flow rate of gas or liquid in the supply flow path becomes deviated from the set flow rate thereof. Therefore, as the amount of the zero point shift becomes greater, the accuracy of controlling the supply flow rate of gas or liquid gets increasingly deteriorated such that its influence on the processes of the wafer W increases to a non-negligible degree.

Particularly in these days, since patterns of a semiconductor device have been further miniaturized, and a thickness of each film has become thinner, the supply flow rate of gas or liquid needs to be controlled with much higher accuracy during the semiconductor manufacturing process such as the film formation process, the etching process and the like. Therefore, the solution to the zero point shift problem has become more important.

In this regard, for example, Patent Document 1 discloses a technique of controlling a supply flow rate of gas with a higher accuracy, by detecting an output voltage of a mass flow controller (MFC output voltage) while stop valves at upstream and downstream sides of the MFCs are closed, in other words, while no actual gas (i.e., gas actually passing through the mass flow controller) flows, and then correcting the detected output voltage. In accordance with this technique, if the second zero point shift due to the thermal siphon effect does not occur because, for example, the mass flow controller is installed in a horizontal orientation, the amount of the first zero point shift is accurately detected. However, if, for example, the MFC is installed in a vertical orientation, the second zero point shift may occur due to the thermal siphon effect depending on conditions, so that the zero point shift cannot be corrected satisfactorily.

More particularly, in Patent Document 1, the stop valves at the upstream and downstream sides of the MFC are closed when the zero point shift is detected. However, although by this the actual gas is prevented from flowing, the second zero point shift occurs if the thermal siphon effect occurs. Further, the amount of the second zero point shift varies, depending on whether or not a fluid is remaining in the MFC, and the kind (molecular weight) and the pressure of the remaining fluid. Therefore, even though the zero point shift is detected when the stop valves are closed, if, for example, the zero point shift is detected while a gas other than that used for a substrate process is remaining, the amount of the second zero point shift included in the detected amount of the zero point shift is different from the amount of the second zero point shift which actually occurs during the substrate process. Therefore, there are cases where the zero point shift that actually occurs during the substrate process cannot be accurately detected, which makes the zero point shift correction unsatisfactory.

Further, Patent Document 2 discloses a technique for preventing a fluid flow in an MFC caused by the thermal siphon effect, by providing, in addition to a lateral flow path and a main flow path, a parallel flow path that is parallel to the lateral flow path, and heating the parallel flow path by a heater. However, MFCs are manufactured by various companies (manufacturers). Therefore, if a production line includes an MFC of a specific manufacturer, an adjustment of the MFC becomes impossible once the MFC is replaced by that of another manufacturer. Further, in this technique, since the parallel flow path parallel to the lateral flow path of the MFC and the heater are added, the internal configuration of the MFC becomes more complicated. Moreover, a temperature of the heater needs to be controlled depending on an installation environment of the MFC and a using condition of the MFC, which makes the control of the MFC more complicated.

SUMMARY OF THE INVENTION

It is, therefore, an object of the present invention to provide a semiconductor fabrication apparatus, a flow rate correction method for a semiconductor fabrication apparatus, and a program therefor, capable of accurately detecting the amount of a zero point shift due to the thermal siphon effect which may actually occur during a substrate process, and accurately correcting the zero point shift to improve the accuracy of flow rate control regardless of an installation arrangement of a flow rate controller.

To achieve the above object, in accordance with one aspect of the present invention, there is provided a semiconductor fabrication apparatus including a substrate processing unit for performing a substrate process for fabricating a semiconductor device on a substrate; a gas supply passage via which a gas is supplied into the substrate processing unit; a flow rate controller installed in the gas supply passage, for comparing an output voltage of a detection unit for detecting a gas flow rate in the gas supply passage with a set voltage that corresponds to a set flow rate set in advance, and controlling the gas flow rate in the gas supply passage to be the set flow rate; stop valves respectively installed in an upstream side and a downstream side of the flow rate controller; and a control unit for setting in the flow rate controller the set voltage to correspond to a gas flow rate of the gas supplied via the gas supply passage, wherein, before the substrate process is performed, the control unit replaces an atmosphere in the flow rate controller at least with a processing gas to be used for the substrate process, detects an output voltage of the flow rate controller while each of the stop valves is closed, and stores the output voltage in a storage unit, and wherein, when the substrate process is performed, the control unit corrects the set voltage to correspond to a gas flow rate of the processing gas to be used for the substrate process based on the output voltage of the flow rate controller stored in the storage unit, and sets the corrected set voltage in the flow rate controller.

To achieve the above object, in accordance with another aspect of the present invention, there is provided a method of correcting a flow rate for a semiconductor fabrication apparatus that performs a substrate process on a substrate in a processing unit for manufacturing a semiconductor device by supplying a gas to the processing unit, by using a flow rate controller that compares an output voltage of a detection unit for detecting a gas flow rate of a gas supply passage with a set voltage that corresponds to a set flow rate set in advance, and controls the gas flow rate of the gas supply passage to be the set flow rate, the method including a zero point shift detection step of, before the substrate process is performed, detecting an output voltage of the flow rate controller in a state where an atmosphere in the flow rate controller is replaced with a processing gas used for the substrate process and each of stop valves respectively installed in an upstream and a downstream side of the flow rate controller is closed, and storing the output voltage as a zero point shift in a storage unit; and a zero point shift correction step of, when the substrate process is performed, correcting the set voltage to correspond to a gas flow rate of the processing gas used for the substrate process based on the zero point shift of the flow rate controller stored in the storage unit, and setting the corrected set voltage in the flow rate controller.

In accordance with the above apparatus or method, the zero point shift (second zero point shift) due to the thermal siphon effect, which may occur during an actual substrate process, can be accurately detected. That is, since an amount of the zero point shift due to the thermal siphon effect varies depending on the kind (molecular weight) of gas, the zero point shift that may occur during the actual substrate process can be accurately detected by detecting the zero point shift (second zero point shift) due to the thermal siphon effect by using the processing gas used for the substrate process.

Further, the second zero point shift can be properly corrected by storing the detected zero point shift (second zero point shift) due to the thermal siphon effect, and correcting, when the substrate process is performed, the set voltage to correspond to the flow rate of the processing gas used for the substrate process. In this manner, the accuracy of controlling the flow rate can be improved without depending on the installation arrangement of the flow rate controller. Further, regardless of the configuration of the flow rate controller, the zero point shift due to the thermal siphon effect can be accurately detected to be properly corrected.

To achieve the above object, in accordance with another aspect of the present invention, there is provided a semiconductor fabrication apparatus including a substrate processing unit for performing a substrate process for fabricating a semiconductor device on a substrate; a plurality of gas supply passages via which plural kinds of gases are supplied into the substrate processing unit; a plurality of flow rate controllers installed respectively in the gas supply passages, for comparing output voltages of detection units for detecting gas flow rates in the gas supply passages with set voltages that correspond to set flow rates set in advance, and controlling the gas flow rates in the gas supply passages to be the set flow rates; stop valves respectively installed in an upstream side and a downstream side each of the flow rate controllers; and a control unit for setting in the flow rate controllers the set voltages to correspond to gas flow rates of the gases supplied via the gas supply passages, wherein, before the substrate process is performed, the control unit replaces atmospheres in the flow rate controllers at least with processing gases to be used for the substrate process, detects output voltages of the flow rate controllers while each of the stop valves is closed, and stores the output voltages in a storage unit, and wherein, when the substrate process is performed, the control unit corrects the set voltages to correspond to gas flow rates of the processing gases to be used for the substrate process based on the output voltages of the flow rate controllers stored in the storage unit, and sets the corrected set voltages in the flow rate controllers.

To achieve the above object, in accordance with another aspect of the present invention, there is provided a method of correcting a flow rate for a semiconductor fabrication apparatus that performs a substrate process on a substrate in a processing unit for manufacturing a semiconductor device by supplying plural kinds of gases to the processing unit, by using a plurality of flow rate controllers that compare output voltages of detection units for detecting gas flow rates of gas supply passages with set voltages that correspond to set flow rates set in advance, and controls the gas flow rates of the gas supply passages to be the set flow rates, the method including a zero point shift detection step of, before the substrate process is performed, detecting output voltages of the flow rate controllers in a state where atmospheres in the flow rate controllers are replaced with processing gases used for the substrate process and each of stop valves respectively installed in upstream and downstream sides of the flow rate controllers is closed, and storing in a storage unit the output voltages as zero point shifts respectively for the processing gases; and a zero point shift correction step of, when the substrate process is performed, correcting the set voltages to correspond to gas flow rates of the processing gases used for the substrate process based on the zero point shifts of the flow rate controllers stored in the storage unit, and setting the corrected set voltages respectively in the flow rate controllers.

In accordance with the above apparatus or method, even if the substrate process is performed by supplying a plurality kinds of gases to the processing unit using a plurality of flow rate controllers, the zero point shifts due to the thermal siphon effect for the respective flow rate controllers, which may occur during the substrate process, can be accurately detected to be properly corrected. In this manner, the accuracy of controlling the flow rate can be improved without depending on the installation arrangement of the flow rate controller.

To achieve the above object, in accordance with another aspect of the present invention, there is provided a semiconductor fabrication apparatus including a substrate processing unit for performing a substrate process for fabricating a semiconductor device on a substrate; a plurality of gas supply passages via which plural kinds of gases are supplied into the substrate processing unit; a common flow rate controller installed in a common path to which all of the gas supply passages are connected, for comparing output voltages of detection units for detecting gas flow rates in the gas supply passages with set voltages that correspond to set flow rates set in advance, and controlling the gas flow rates in the gas supply passages to be the set flow rates; downstream stop valves respectively installed in the gas supply passages at downstream sides of the common flow rate controller; an upstream stop valve installed in an upstream side of the common flow rate controller; and a control unit for respectively setting in the common flow rate controller the set voltages to correspond to gas flow rates of the gases supplied via the gas supply passages, wherein, before the substrate process is performed, the control unit replaces an atmosphere in the common flow rate controller at least with each of processing gases to be used for the substrate process, detects output voltages of the common flow rate controller respectively for the processing gases while each of the stop valves is closed, and stores the output voltages in a storage unit respectively for the processing gases, and wherein, when the substrate process is performed, the control unit corrects the set voltages to correspond to gas flow rates of the processing gases to be used for the substrate process based on the output voltages of the common flow rate controller stored for the respective processing gases in the storage unit, and sets the corrected set voltages in the common flow rate controller.

To achieve the above object, in accordance with another aspect of the present invention, there is provided a method of correcting a flow rate for a semiconductor fabrication apparatus that performs a substrate process on a substrate in a processing unit for manufacturing a semiconductor device by supplying plural kinds of gases to the processing unit, by using a flow rate controller that compares output voltages of a detection unit for detecting gas flow rates of a gas supply passage with set voltages that correspond to set flow rates set in advance, and controls the gas flow rates of the gas supply passage to be the set flow rates, the method including a zero point shift detection step of, before the substrate process is performed, detecting output voltages of the flow rate controller respectively for the processing gases in a state where an atmosphere in the flow rate controller is replaced with each of the processing gases used for the substrate process and each of stop valves respectively installed in an upstream and a downstream side of the flow rate controller is closed, and storing the output voltages as zero point shifts respectively for the processing gases in a storage unit; and a zero point shift correction step of, when the substrate process is performed, correcting the set voltages to correspond to gas flow rates of the processing gases used for the substrate process based on the zero point shifts of the flow rate controllers stored in the storage unit, and setting the corrected set voltages in the flow rate controller.

In accordance with the above apparatus or method, even if the substrate process is performed by supplying a plurality kinds of gases to the processing unit using a common flow rate controller, the zero point shift due to the thermal siphon effect for the common flow rate controller, which may occur during the substrate process, can be accurately detected to be properly corrected. In this manner, the accuracy of controlling the flow rate can be improved without depending on the installation arrangement of the flow rate controller.

To achieve the above object, in accordance with another aspect of the present invention, there is provided a semiconductor fabrication apparatus including a substrate processing unit for performing a substrate process for fabricating a semiconductor device on a substrate; a gas supply passage via which a gas is supplied into the substrate processing unit; a flow rate controller installed in the gas supply passage, for comparing an output voltage of a detection unit for detecting a gas flow rate in the gas supply passage with a set voltage that corresponds to a set flow rate set in advance, and controlling the gas flow rate in the gas supply passage to be the set flow rate; stop valves respectively installed in an upstream side and a downstream side of the flow rate controller; a vacuum exhaust unit for vacuum exhausting an inside of the flow rate controller; and a control unit for setting in the flow rate controller the set voltage to correspond to a gas flow rate of the gas supplied via the gas supply passage, wherein, before a substrate process is performed, the control unit detects an output voltage of the flow rate controller as a first zero point shift in a state where the inside of the flow rate controller is vacuum exhausted by the vacuum exhaust unit and each of the stop valves is closed, performs a zero point correction based on the first zero point shift, subsequently detects another output voltage of the flow rate controller in a state where an atmosphere in the flow rate controller is replaced with at least a processing gas used for the substrate process and each of the stop valves is closed, and stores said another output voltage as a second zero point shift in a storage unit, and wherein, when the substrate process is performed, the control unit detects an output voltage of the flow rate controller as another first zero point shift in a state where the inside of the flow rate controller is vacuum exhausted by the vacuum exhaust unit and each of the stop valves is closed, performs a zero point correction based on said another first zero point shift, subsequently corrects the set voltage which corresponds to a flow rate of the processing gas used for the substrate process based on the second zero point shift stored in the storage unit, and sets the corrected set voltage in the flow rate controller.

To achieve the above object, in accordance with another aspect of the present invention, there is provided a method of correcting a flow rate for a semiconductor fabrication apparatus that performs a substrate process on a substrate in a processing unit for manufacturing a semiconductor device by supplying a gas to the processing unit, by using a flow rate controller that compares an output voltage of a detection unit for detecting a gas flow rate of a gas supply passage with a set voltage that corresponds to a set flow rate set in advance, and controls the gas flow rate of the gas supply passage to be the set flow rate, the method including a second zero point shift detection step of, before the substrate process is performed, detecting an output voltage of the flow rate controller as a first zero point shift in a state where an inside of the flow rate controller is vacuum exhausted by a vacuum exhaust unit and each of stop valves is closed, performing a zero point correction based on the first zero point shift, subsequently detecting another output voltage of the flow rate controller in a state where an atmosphere in the flow rate controller is replaced at least with a processing gas used for the substrate process and each of the stop valves is closed, and storing said another output voltage as a second zero point shift in a storage unit; and a second zero point shift correction step of, when the substrate process is performed, detecting an output voltage of the flow rate controller as another first zero point shift in a state where the inside of the flow rate controller is vacuum exhausted by the vacuum exhaust unit and each of the stop valves is closed, performing the zero point correction based on said another first zero point shift, correcting the set voltage to correspond to a flow rate of the processing gas used for the substrate process based on the second zero point shift stored in the storage unit, setting the corrected set voltage in the flow rate controller.

In accordance with the above apparatus and method, the first zero point shift due to the use of the flow rate controller is detected to be corrected before the second zero point shift due to the thermal siphon effect is detected. Therefore, the second zero point shift due to the thermal siphon effect can be accurately detected without being affected by the first zero point shift. Further, when detecting the first zero point shift, the stop valves respectively for the flow rate controllers are closed to prevent an actual gas from flowing therein, and the inside of the flow rate controller is vacuum exhausted. Thus, the inside of the flow rate controller becomes in a vacuum state in which no fluid that can generate a flow exists therein. Therefore, since the thermal siphon effect does not occur, the first zero point shift can be detected in a state where the second zero point shift due to the thermal siphon effect does not occur. In this manner, the first zero point shift can be detected accurately.

Further, when the substrate process is performed, the first zero point shift due to the use of the flow rate controller is detected to be corrected before the second zero point shift due to the thermal siphon effect is detected. Therefore, the second zero point shift due to the thermal siphon effect can be accurately detected without being affected by the first zero point shift. In this manner, the accuracy of controlling the flow rate can be improved without depending on the installation arrangement of the flow rate controller.

To achieve the above object, in accordance with another aspect of the present invention, there is provided a semiconductor fabrication apparatus including a substrate processing unit for performing a substrate process for fabricating a semiconductor device on a substrate; a gas supply passage via which a gas is supplied into the substrate processing unit; a flow rate controller installed in the gas supply passage, for comparing an output voltage of a detection unit for detecting a gas flow rate in the gas supply passage with a set voltage that corresponds to a set flow rate set in advance, and controlling the gas flow rate in the gas supply passage to be the set flow rate; stop valves respectively installed in an upstream side and a downstream side of the flow rate controller; a vacuum exhaust unit for vacuum exhausting an inside of the flow rate controller; and a control unit for setting in the flow rate controller the set voltage to correspond to a gas flow rate of the gas supplied via the gas supply passage, wherein, before a substrate process is performed, the control unit detects an output voltage of the flow rate controller as a first zero point shift in a state where the inside of the flow rate controller is vacuum exhausted by the vacuum exhaust unit and each of the stop valves is closed, performs a zero point correction based on the first zero point shift, subsequently detects another output voltage of the flow rate controller in a state where an atmosphere in the flow rate controller is replaced with at least a processing gas used for the substrate process and each of the stop valves is closed, and stores said another output voltage as a second zero point shift in a storage unit, and wherein, when the substrate process is performed, the control unit detects an output voltage of the flow rate controller as another first zero point shift in a state where the inside of the flow rate controller is vacuum exhausted by the vacuum exhaust unit and each of the stop valves is closed, subsequently corrects the set voltage to correspond to a flow rate of the processing gas used for the substrate process based on the second zero point shift stored in the storage unit and said another first zero point shift detected when the substrate process is performed, and sets the corrected set voltage in the flow rate controller.

To achieve the above object, in accordance with another aspect of the present invention, there is provided a method of correcting a flow rate for a semiconductor fabrication apparatus that performs a substrate process on a substrate in a processing unit for manufacturing a semiconductor device by supplying a gas to the processing unit, by using a flow rate controller that compares an output voltage of a detection unit for detecting a gas flow rate of a gas supply passage with a set voltage that corresponds to a set flow rate set in advance, and controls the gas flow rate of the gas supply passage to be the set flow rate, the method including a second zero point shift detection step of, before the substrate process is performed, detecting an output voltage of the flow rate controller as a first zero point shift in a state where an inside of the flow rate controller is vacuum exhausted by a vacuum exhaust unit and each of stop valves is closed, performing a zero point correction based on the first zero point shift, subsequently detecting another output voltage of the flow rate controller in a state where an atmosphere in the flow rate controller is replaced at least with a processing gas used for the substrate process and each of the stop valves is closed, and storing said another output voltage as a second zero point shift in a storage unit; and a second zero point shift correction step of, when the substrate process is performed, detecting an output voltage of the flow rate controller as another first zero point shift in a state where the inside of the flow rate controller is vacuum exhausted by the vacuum exhaust unit and each of the stop valves is closed, correcting the set voltage to correspond to a flow rate of the processing gas used for the substrate process based on the second zero point shift stored in the storage unit and said another first zero point shift detected when the substrate process is performed, setting the corrected set voltage in the flow rate controller.

In accordance with the above apparatus or method, when the substrate process is performed, the first and the second zero point shift is detected, and the set voltage is corrected to correspond to the flow rate of the processing gas used for the substrate process based both on the first and the second zero point shift. Thus, the first and the second zero point shift can be corrected simultaneously. In this manner, the accuracy of controlling the flow rate can be improved without depending on the installation arrangement of the flow rate controller.

Further, it is preferable that an accumulated amount of the first zero point shift is stored in the storage unit whenever the first zero point shift is detected, and, when the first zero point shift is newly detected, if a sum of the newly detected first zero point shift and the accumulated amount of the first zero point shift acquired up to a previous time is greater than a threshold, a notifying process is performed. Thus, a malfunction of the flow rate controller or a time to replace the flow rate controller can be informed.

To achieve the above object, in accordance with another aspect of the present invention, there is provided a program for performing a flow rate correction process in a semiconductor fabrication apparatus that performs a substrate process on a substrate in a processing unit for manufacturing a semiconductor device by supplying a gas to the processing unit, by using a flow rate controller that compares an output voltage of a detection unit for detecting a gas flow rate of a gas supply passage with a set voltage that corresponds to a set flow rate set in advance, and controls the gas flow rate of the gas supply passage to be the set flow rate, the program running on a computer to execute the processes of a zero point shift detection of, before the substrate process is performed, detecting an output voltage of the flow rate controller in a state where an atmosphere in the flow rate controller is replaced with a processing gas used for the substrate process and each of stop valves respectively installed in an upstream and a downstream side of the flow rate controller is closed, and storing the output voltage as a zero point shift in a storage unit; and a zero point shift correction of, when the substrate process is performed, correcting the set voltage to correspond to a gas flow rate of the processing gas used for the substrate process based on the zero point shift of the flow rate controller stored in the storage unit, and setting the corrected set voltage in the flow rate controller.

In accordance with the above program, it is possible to perform a flow rate control capable of accurately detecting and properly correcting the zero point shift (second zero point shift) due to the thermal siphon effect which may occur during an actual substrate process.

To achieve the above object, in accordance with another aspect of the present invention, there is provided a program for performing a flow rate correction process in a semiconductor fabrication apparatus that performs a substrate process on a substrate in a processing unit for manufacturing a semiconductor device by supplying a gas to the processing unit, by using a flow rate controller that compares an output voltage of a detection unit for detecting a gas flow rate of a gas supply passage with a set voltage that corresponds to a set flow rate set in advance, and controls the gas flow rate of the gas supply passage to be the set flow rate, the program running on a computer to execute the processes of a second zero point shift detection of, before the substrate process is performed, detecting an output voltage of the flow rate controller as a first zero point shift in a state where an inside of the flow rate controller is vacuum exhausted by a vacuum exhaust unit and each of stop valves is closed, performing a zero point correction based on the first zero point shift, subsequently detecting another output voltage of the flow rate controller in a state where an atmosphere in the flow rate controller is replaced at least with a processing gas used for the substrate process and each of the stop valves is closed, and storing said another output voltage as a second zero point shift in a storage unit; and a second zero point shift correction of, when the substrate process is performed, detecting an output voltage of the flow rate controller as another first zero point shift in a state where the inside of the flow rate controller is vacuum exhausted by the vacuum exhaust unit and each of the stop valves is closed, performing the zero point correction based on said another first zero point shift, correcting the set voltage to correspond to a flow rate of the processing gas used for the substrate process based on the second zero point shift stored in the storage unit, setting the corrected set voltage in the flow rate controller.

In accordance with the above program, it is possible to perform a flow rate control capable of accurately detecting and correcting the first zero point shift due to the use of the flow rate controller in a state where the effect of the second zero shift does not exist, and accurately detecting and correcting the second zero point shift due to the thermal siphon effect in a state where the effect of the second zero shift does not exist.

In accordance with the present invention, the amount of the zero point shift due to the thermal siphon effect, which actually occurs during the substrate process, can be accurately detected and properly corrected. Therefore, the accuracy of controlling the flow rate is greatly improved without depending on the installation arrangement of the flow rate controller. Furthermore, the amount of the zero point shift due to the thermal siphon effect is accurately detected to be corrected without depending on the configuration of the flow rate controller.

BRIEF DESCRIPTION OF THE DRAWINGS

FIG. 5 is illustrates a specified example of first zero point shift data in accordance with the first embodiment;

FIG. 6 is illustrates a specified example of second zero point shift data in accordance with the first embodiment;

FIG. 13 is illustrates a specified example of first zero point shift data in accordance with the second embodiment; and FIG. 14 is illustrates a specified example of second zero point shift data in accordance with the second embodiment.

Figure 1:
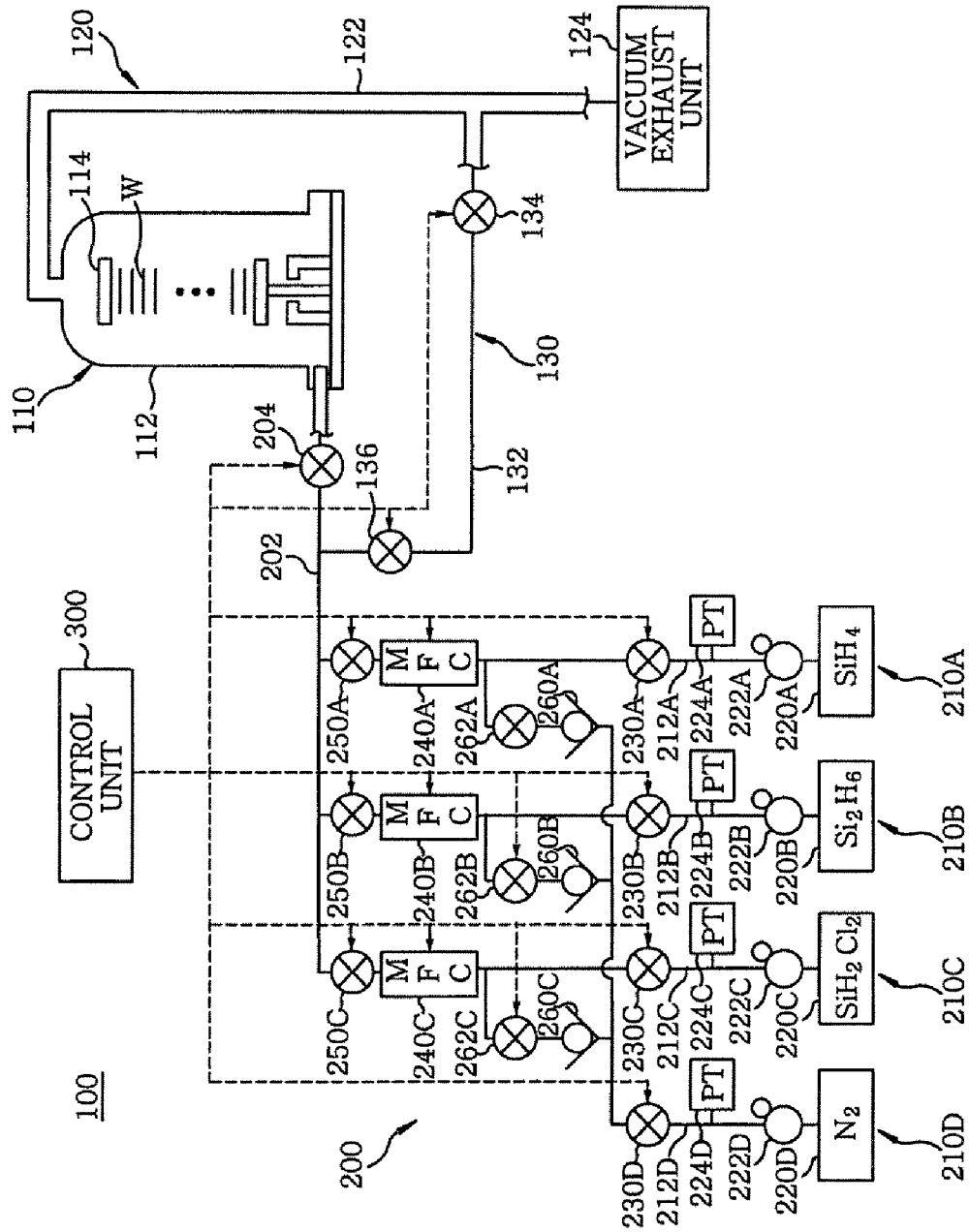
FIG. 1 is a block diagram of an example of the configuration of a semiconductor fabrication apparatus in accordance with a first embodiment of the present invention.

100 heat treatment apparatus
110 heat treatment unit
112 reaction tube
114 holding unit
120 exhaust system
122 exhaust pipe
124 vacuum exhaust unit
130 bypass line
132 bypass pipe
134 exhaust-side bypass stop valve
136 supply-side bypass stop valve
200 gas supply system
202 gas supply pipe
204 main valve
210 (210A~210D) gas supply passages
212 (212A~212D) gas supply pipes
220 (220A~220D) gas supply sources
222 (222A~222D) regulators
224 (224A~224D) pressure gauges
230 (230A~230D) first stop valves (upstream stop valves)
240 (240A~240C) mass flow controller (MFC)
241 main flow path
242 lateral flow path
243 upstream sensor
244 downstream sensor
245 bypass path
246 control valve (flow rate control valve)
247 MFC control circuit
250 (250A~250C) second stop valves (downstream stop valves)
260 (260A~260D) check valves
262 (262A~262C) stop valves
300 control unit
310 CPU
320 RAM
330 display unit
340 input/output unit
350 notification unit
360 unit controller
370 program data storage unit
371 process program
372 flow rate correction program
373 first zero point shift detection program
374 first zero point shift correction program
375 second zero point shift detection program
376 second zero point shift correction program
380 process data storage unit
381 process data
382 flow rate correction data
W wafer

DETAILED DESCRIPTION OF THE EMBODIMENTS

Hereinafter, embodiments of the present invention will be described in detail with reference to the accompanying drawings so that they can be readily implemented by those skilled in the art. In the detailed description and drawings, elements having substantially same functions and configurations are indicated by same reference numerals, and no repeated description thereof will be presented.

Example of Configuration of Semiconductor Fabrication Apparatus in accordance with First Embodiment A semiconductor fabrication apparatus in accordance with a first embodiment of the present invention will be described with reference to the drawings. As an example of the semiconductor fabrication apparatus, a heat treatment apparatus for performing a specific heat treatment on a substrate, for example, a semiconductor wafer (hereinafter, referred to as a "wafer"), will be described. FIG. 1 shows an example of the configuration of the heat treatment apparatus in accordance with the first embodiment. The heat treatment apparatus 100 includes a heat treatment unit 110 as a processing unit for performing a process (for example, heat treatment) on the wafer W. The heat treatment unit 110 includes a bell-shaped reaction tube 112 having, for example, a reaction container (process container) or a reaction chamber (process chamber) shown in FIG. 1. A holding unit 114 loading a plurality of wafers is carried into the reaction tube 112. The heat treatment unit 110 further includes an exhaust system 120 for exhausting an inside of the reaction tube 112, a gas supply system 200 for supplying specific gases into the reaction tube 112, and a heating unit configured by, for example, a heater (not shown), installed outside of the reaction tube 112.

When the holding unit 114 loaded with a plurality of wafers W is carried into the reaction tube 112, the heat treatment unit 110 supplies the specific gases into the reaction tube 112 by using the gas supply system 200, and exhausts an inside of the reaction tube 112 by using the exhaust system 120. Meanwhile, the heat treatment unit 110 performs the specific heat treatment on the wafer W by heating the reaction tube 112 from an outer surface thereof by using the heating unit.

The exhaust system 120 is formed by connecting a vacuum exhaust unit 124 having, e.g., a vacuum pump to the ceiling of the reaction tube 112 through an exhaust pipe 122. The gas supply system 200 is configured, for example, by connecting gas supply passages 210A, 210B, 210C and 210D for supplying respective gases to the gas supply pipe 202. The gas supply pipe 202 is connected to a lower side of the reaction tube 112 via a main valve 204.

Further, the exhaust pipe 122 of the exhaust system 120 is indirectly connected to the gas supply pipe 202 of the gas supply system 200 via a bypass line 130. The bypass line 130 is configured by connecting a bypass pipe 132 between a downstream side of each connection part of the gas supply passages 210A, 210B, 210C and 210D and an upstream side of the main valve 204 in the gas supply pipe 202. An exhaust-side bypass stop valve 134 is connected to an exhaust-side (i.e., a side of the exhaust system 120) of the bypass pipe 132, and a supply-side bypass stop valve 136 is connected to a supply-side (i.e., a side of the gas supply system 200) of the bypass pipe 132.

Hereinafter, each of the gas supply passages 210A, 210B, 210C and 210D of the gas supply system 200 will be described. The heat treatment apparatus 100 shown in FIG. 1 is configured to supply four kinds of gases (for example, $SiH_4$ gas, $Si_2H_6$ gas, $SiH_2Cl_2$ gas and $N_2$ gas) to the reaction tube 112. Among these gases, $SiH_4$ gas, $Si_2H_6$ gas, $SiH_2Cl_2$ gas are mainly used as reaction gases, and $N_2$ gas is mainly used as a purge gas for purging each of the gas supply passages 210A, 210B, 210C and 210D and the reaction tube 110.

The gas supply passages 210A, 210B and 210C of $SiH_4$ gas, $Si_2H_6$ gas and $SiH_2Cl_2$ gas, which are used as the reaction gases, are configured in a same manner. Specifically, the gas supply passages 210A, 210B and 210C include gas supply sources 220A, 220B and 220C for $SiH_4$ gas, $Si_2H_6$ gas and $SiH_2Cl_2$ gas, respectively. The gas supply sources 220A, 220B and 220C are connected, respectively via the gas supply pipes 212A, 212B and 212C, to the gas supply pipe 202, at which the gas supply sources 220A, 220B and 220C are joined together.

As an example of the flow rate controllers, mass flow controllers (MFC) 240A, 240B and 240C that control flow rates of the gases supplied from the gas supply sources 220A, 220B and 220C are respectively installed in the gas supply pipes 212A, 212B and 212C of the gas supply passages 210A, 210B and 210C. Here, the MFCs 240A, 240B and 240C may have different capacities. For example, the capacities of the MFCs 240A, 240B and 240C may be 500 cc, 3000 cc and 2000 cc, respectively.

First stop valves (upstream stop valves) 230A, 230B and 230C are installed at upstream sides of the MFCs 240A, 240B and 240C, respectively. Second stop valves (downstream stop valves) 250A, 250B and 250C are installed at downstream sides of the MFCs 240A, 240B and 240C, respectively. By closing the first stop valves 230A, 230B and 230C and the second stop valves 250A, 250B and 250C, fluids (which is gases in the present embodiment) are prevented from flowing in the MFCs 240A, 240B and 240C. That is, the flow rate of the gas which actually passes through each of the MFCs 240A, 240B and 240C can be controlled to be zero.

Further, as shown in FIG. 1, regulators 222A, 222B and 222C and pressure gauges (PT) 224A, 224B and 224C may be additionally installed between the gas supply sources 220A, 220B and 220C and the first stop valves (upstream stop valves) 230A, 230B and 230C, respectively.

The gas supply passage 210D of $N_2$ gas used as the purge gas includes a gas supply source 220D of $N_2$ gas. $N_2$ gas is supplied from the gas supply source 220D to the reaction tube 112 via the MFCs 240A, 240B and 240C and the second stop valves 250A, 250B and 250C of the gas supply passages 210A, 210B and 210C of the other gases. Since the MFCs 240A, 240B and 240C are used for $N_2$ gas as well, there is no need to prepare an additional MFC only for $N_2$ gas.

Specifically, the gas supply source 220D of $N_2$ gas is connected, through a gas supply pipe 212D, to the gas supply passages 210A, 210B and 210C via check valves 260A, 260B and 260C and via stop valves 262A, 262B and 262C at positions between the first stop valves 230A, 230B and 230C and the MFCs 240A, 240B and 240C, respectively. The gas supply pipe 212D of the gas supply passage 210D is, in a manner same as the other gas supply passages 210A, 210B and 210C, connected to a regulator 222D, a pressure gauge (PT) 224D and a first stop valve (upstream stop valve) 230D. Further, if a flow rate of $N_2$ gas is controlled by the MFCs 240A, 240B and 240C, the stop valves 262A, 262B and 262C may be controlled by the first stop valves (upstream stop valves) installed at the upstream side of the MFCs 240A, 240B and 240C.

Figure 2:
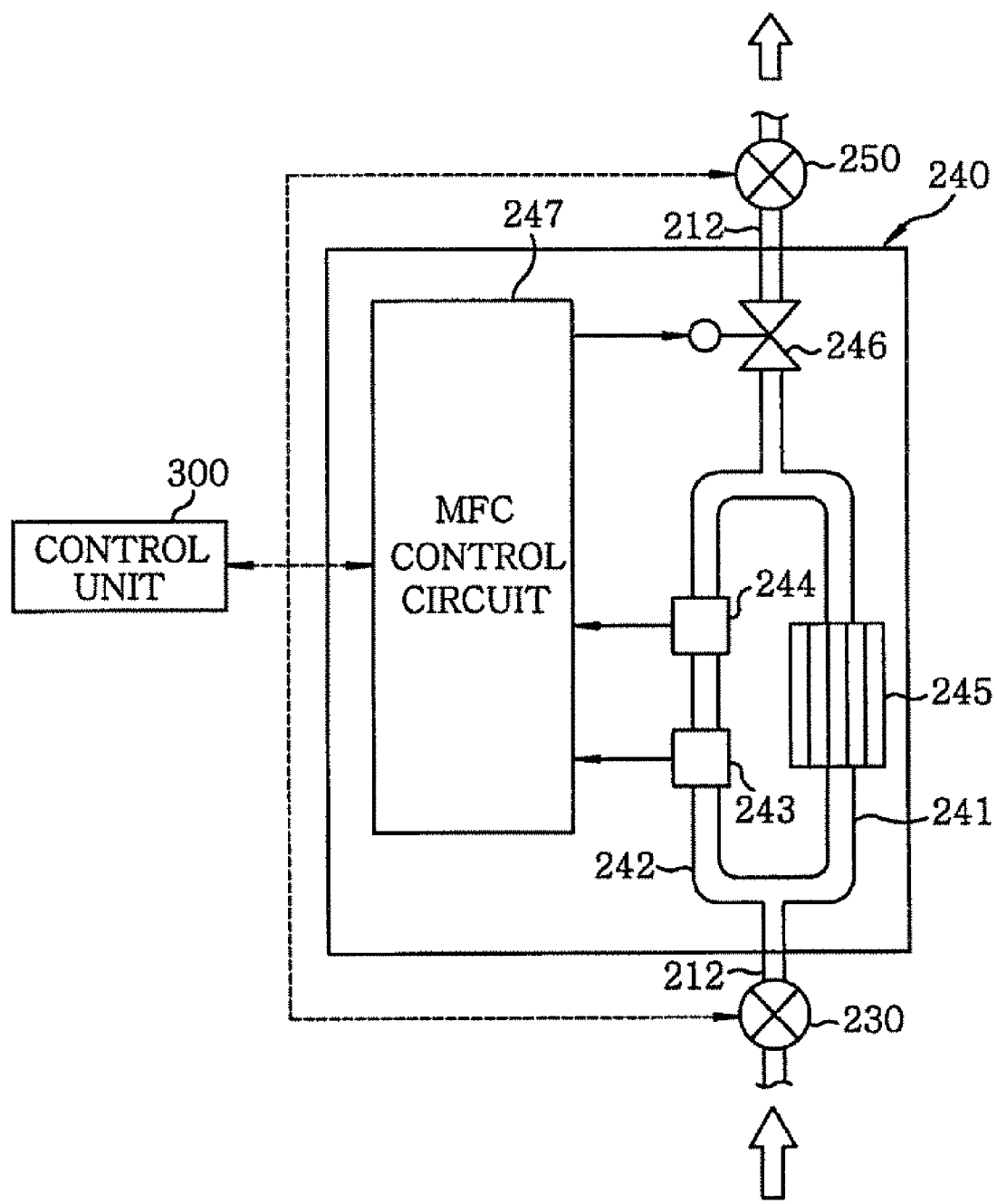
FIG. 2 illustrates an example of the configuration of a mass flow controller of FIG. 1.

Now, the MFCs will be described with reference to the drawing. FIG. 2 illustrates an example of the configuration of each of the MFCs in accordance with the first embodiment. Since the MFCs 240A, 240B and 240C have a same configuration, they will be referred to as the MFC with a reference numeral without "A", "B" and "C". Therefore, for example, MFC 240 represents each of the MFCs 240A, 240B and 240C.

As shown in FIG. 2, the MFC 240 includes a main flow path 241 and a lateral flow path 242 which are internally divided from the gas supply pipe 212. Specifically, in the MFC 240, a gas flowing from the gas supply pipe 212 through a gas inlet is branched off into the main flow path 241 and the lateral flow path 242, and then is merged again. Thus merged gas flows from a gas outlet into the gas supply pipe 212 again via a control valve (flow rate control valve) 246 which is a flow rate control unit.

A flow rate sensor for measuring a flow rate in the gas supply pipe 212 is installed in the lateral flow path 242. The flow rate sensor includes an upstream sensor 243 and a downstream sensor 244. The upstream sensor 243 is positioned at the upstream side of the lateral flow path 242, and the downstream sensor 244 is positioned at the downstream side of the lateral flow path 242. Each of the upstream sensor 243 and the downstream sensor 244 includes, for example, a heat generating resistance wire.

A bypass path 245, formed in the main flow path 241, is configured such that a flow rate, a temperature, pressure and the like in the main flow path 241 are same as those in the lateral flow path 242. Therefore, an error in measurement by the flow rate sensor (including the upstream sensor 243 and the downstream sensor 244) can be prevented.

The principle of detecting a flow rate by the MFC 240 will be described in the following. When a fluid flows therein, the upstream sensor 243 gets cooled and a temperature thereat falls, while the downstream sensor 244 gets heated and a temperature thereat rises. As a result, a temperature difference occurs between the temperature detected by the upstream sensor 243 and that detected by the downstream sensor 244, so that a flow rate can be detected by detecting an output voltage (an MFC output voltage) generated by the temperature difference.

The MFC 240 includes an MFC control circuit 247. The MFC control circuit 247 controls a flow rate in the gas supply pipe 212 to be a set flow rate, by controlling the opening level of the control valve (flow rate control valve) 246, based on outputs from the flow rate sensors (including the upstream sensor 243 and the downstream sensor 244). Although not shown, the MFC control circuit 247 includes a flow rate detecting unit having, for example, a bridge circuit that detects a difference between a resistance of the upstream sensor 243 and that of the downstream sensor 244 as a voltage signal, and an amplifying circuit that amplifies the voltage signal; and a comparing unit that compares a set signal, (set voltage) received as an indicator of the set flow rate, with the voltage outputted from the amplifying circuit, and outputs an operation signal to the control valve 246 to adjust the opening level of the control valve 246 in accordance with the result of the comparison.

The MFC control circuit 247 is connected to, for example, a control unit 300 of the heat treatment apparatus 100 via a signal conversion unit (not shown). The signal conversion unit converts an analog signal outputted from the MFC 240 into a digital signal, and converts the digital signal outputted from the control unit 300 into an analog signal.

When controlling the flow rate by the MFC 240, the control unit 300 of the heat treatment apparatus 100 transmits a flow rate set instruction including the data of the set flow rate (and/or the set voltage) to the MFC control circuit 247. Then, the MFC control circuit 247 controls the flow rate in the gas supply pipe 212 to be the set flow rate (represented by the set voltage). Further, when a zero point set instruction is received from the control unit 300 of the heat treatment apparatus 100, the MFC control circuit 247 sets a present flow rate to be zero. When a flow rate detection instruction is received from the control unit 300 of the heat treatment apparatus 100, the MFC control circuit 247 detects a flow rate, and sends the result of detection to the control unit 300 as the MFC output voltage in accordance with the flow rate (for example, a detection voltage with a full scale (FS) of 5V). For example, the control unit 300 of the heat treatment apparatus 100 detects a first zero point shift and a second zero point shift based on the MFC output voltage of the MFC control circuit 247.

The data exchange between the MFC control circuit 247 and the control unit 300 of the heat treatment apparatus 100 is performed through, for example, a GHOST network. The GHOST network is realized by an LSI referred to as "General High-speed Optimum Scalable Transceiver (GHOST)" provided in the control unit 300. The LSI of GHOST is mounted on, specifically, a module controller (MC) board of a module controller (MC) which forms a unit controller 360 that will be described later. A plurality of I/O modules can be connected to the GHOST network. The GHOST network is constructed by connecting each MFC control circuit to an I/O unit of the I/O module.

However, generally, an actual flow rate may be deviated from the set flow rate while the MFC is being used, as described above. For example, even when the actual flow rate is zero, there are many cases where the detection voltage of the flow rate detected by the flow rate sensor (including, for example, the upstream sensor 243 and the downstream sensor 244) is not zero, generating an error with slight deviation. Examples of this deviation of a zero point (i.e., zero point shift) include a deviation which tends to be slowly increased in proportion to a used time and a deviation in which a change rate (slope) of the output voltage to the flow rate changes (span shift). Hereinafter, this kind of zero point shift will be referred to as a use-based zero point shift (or a first zero point shift).

The first zero point shift occurs by the following factors: an error generated by a difference between an environment temperature of the MFC at the time of being shipped by a manufacturer (manufacturing company) and that at the time of being used; an aging deterioration or a peeling-off of coating material of a coil-shaped heat generating resistance wire (sensor), which is an element of the bridge circuit; a loosened coil of the heat generating resistance wire; a defect in a circuit part; a change in a source voltage; a contamination (corrosion or by-product attachment) in a pipe path around which the sensor is wound; and the like.

When the first zero point shift occurs, there will be a discrepancy developed between a set flow rate of gas and an actual flow rate thereof. As the amount of the first zero point shift becomes greater, the influence on the process of the wafer W gets stronger. For this reason, in the first embodiment, the first zero point shift is regularly detected and corrected.

Further, generally, the deviation of the zero point (zero point shift) may be generated due to the molecular weight or pressure of gas and the like caused by, due to the installation arrangement of the MFC. This kind of zero point shift does not occur if the MFC is installed in a horizontal orientation (such as in a transverse layout). However, if the MFC is installed in other orientations than the horizontal orientation, for example, if the MFC is installed in a vertical orientation (such as in a longitudinal layout or an L-shaped layout), the zero point shift may occur. In the present application, this kind of zero point shift is referred to as an installation arrangement-based zero point shift (or a second zero point shift) to distinguish it from the aforementioned use-based zero point (the first zero point shift).

For the reasons of a miniaturization of semiconductor fabrication apparatus, a configuration of a pipe laying system, an installation space and the like, the lateral flow path 242 (which is parallel to the main flow path 241), around which the upstream sensor 243 and downstream sensor 244 of the MFC 240 as shown in FIG. 2 are wound, has to be installed in a vertical state (vertical orientation). However, if the MFC is installed in the vertical orientation, the second zero point shift may occur depending on the molecular weight or pressure of gas. This is generally referred to as thermal siphon effect.

Here, what causes the thermal siphon effect will be described with reference to FIG. 2. When a gas passes through the lateral flow path 242 of the MFC 240, and gets heated by the upstream sensor 243 and the downstream sensor 244, the heated gas moves up in the lateral flow path 242. Subsequently, the gas gets cooled to move down in the bypass path 245 of the main flow path, and returns to the lateral flow path 242. Accordingly, a circulating flow of the gas is generated between the lateral flow path 242 and the main flow path 241. Therefore, if, for example, the MFC 240 is installed such that a gas inlet thereof is arranged at a lower side position as shown in FIG. 2, the gas flows in a forward direction in the lateral flow path 242 around which the upstream sensor 243 and the downstream sensor 244 are wound, thereby generating an increased output. To the contrary, if the gas inlet is arranged at a upper side position, a decreased output is generated. In this example, the thermal siphon effect has been described regarding a case where the MFC 240 is vertically arranged. However, even if the MFC 240 is nearly horizontally arranged (for example, in a case where the MFC 240 is arranged to slope from the level as a result of an error in the installation and the like), the thermal siphon effect may also occur.

Figure 3:
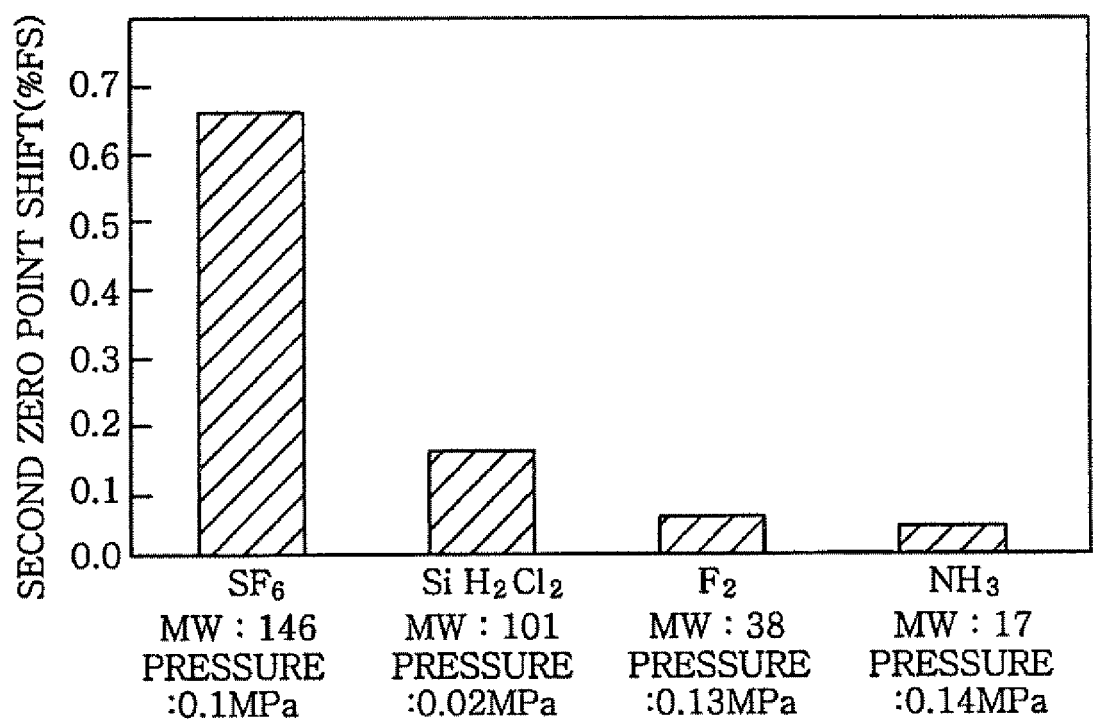
FIG. 3 is a graph representing the relation between the amount of a second zero point shift and the kind of gas.

Unlike the use-based zero point shift (the first zero point shift) due to the use of the MFC 240, the amount of the arrangement-based zero point shift (the second zero point shift) due to the installation arrangement of the MFC 240 is not dependent on the use, and a characteristic value thereof is determined mainly by the installation arrangement, the kind of gas (the molecular weight of gas) and the pressure of gas, as shown in FIG. 3.

FIG. 3 is a graph that shows the relation between the kinds of gas and the amount of the second zero point shift in, for example, the MFC arranged vertically as shown in FIG. 2. The results shown in the graph of FIG. 3 were obtained by conducting a following experiment. Firstly, the output voltage of the zero point position was observed while the MFC was at a vacuum level without any fluid that could generate a flow therein, i.e., while the second zero point shift due to the thermal siphon effect did not occur. After the gases with different molecular weights (for example, $SF_6$ gas, $SiH_2Cl_2$ gas, $F_2$ gas and $NH_3$ gas) were respectively supplied into the MFC, the amount of the second zero point shift was obtained by measuring an increased amount of the output voltage. FIG. 3 depicts percentage rates of the output voltage with respect to a full scale (FS: 5V). Accordingly, if a bar in FIG. 3 is longer, it means that the amount of the second zero point shift is greater.

In FIG. 3, as the molecular weight gets greater in the order of $NH_3$ gas, $F_2$ gas, $SiH_2Cl_2$ gas and $SF_6$ gas, the zero point shift (the second zero point shift) due to the installation arrangement is increased. Further, the zero point shift (the second zero point shift) due to the installation arrangement is not affected by the use of the MFC.

As described above, the arrangement-based zero point shift (the second zero point shift) is determined by the kinds of gas (the molecular weight of gas) or the pressure thereof. Therefore, if the amount of the zero point shift is detected at a time when, e.g., the heat treatment apparatus 100 is first installed in a factory or the pressure condition or the like is changed, the flow rate of each gas when the heat treatment apparatus 100 is being operated can be determined by considering the detected amount of the second zero point shift.

Since the second zero point shift depends on the installation arrangement of the MFC 240, even if the first zero point shift is corrected at a proper timing, the actual flow rate of gas may be deviated from the set flow rate thereof because of the second zero point shift. Further, even though the zero point shift is detected while the stop valves 230 and 250 in the upstream and downstream sides of the MFC 240 are closed (which means no actual gas flows therein), if the inside of the MFC 240 is not vacuum exhausted, the thermal siphon effect may occur therein.

In this case, as described above, the amount of the second zero point shift varies depending on the kind (molecular weight) or pressure of the fluid remaining in the MFC. Therefore, even though the zero point shift is detected while the stop valves 230 and 250 are closed, if that zero point shift is detected while, for example, a processing gas used during the wafer process and other gas still remain in the MFC, an actual zero point shift that actually occurs during the wafer process cannot be accurately detected, so that the zero point correction cannot be satisfactorily performed.

In this regard, in accordance with the present invention, the amount of the zero point shift due to the thermal siphon effect (the amount of the second zero point shift), which actually occurs during the wafer process, can be accurately detected and properly corrected through a flow rate correction process that will be described later. In accordance with the flow rate correction process, the accuracy of controlling the flow rate is further improved, regardless of the installation arrangement of the flow rate controller.

In the first embodiment, the heat treatment apparatus 100 performs the flow rate correction process including processes of detecting and correcting the first zero point shift and the second zero point shift. The flow rate correction process is performed, based on a preset program, by the control unit 300 that controls each of the other units of the heat treatment apparatus 100.

Example of Configuration of Control Unit

Figure 4:
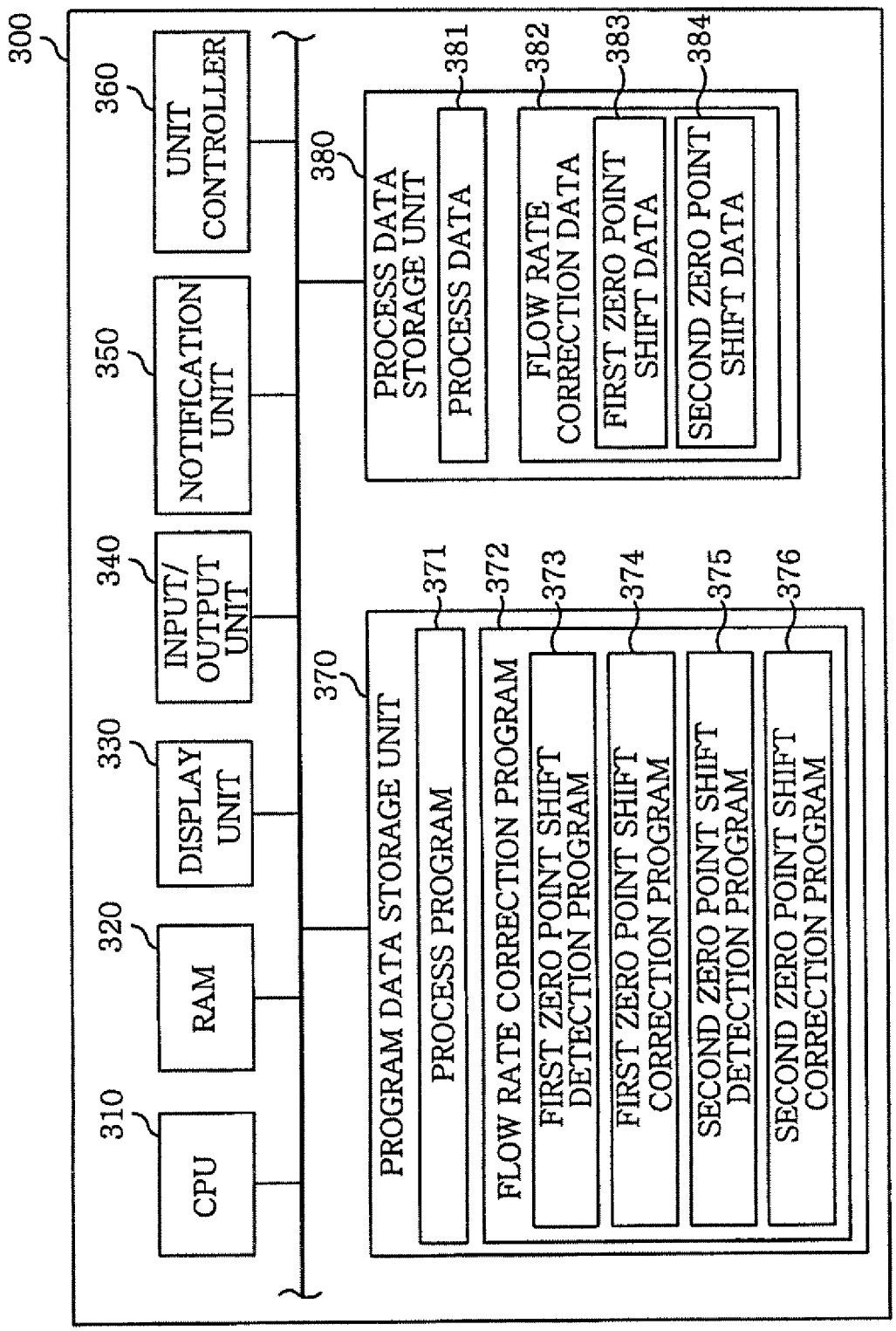
FIG. 4 is a block diagram of an example of the configuration of a control unit shown in FIG. 1.

FIG. 4 illustrates an example of the configuration of the control unit 300 that performs a flow rate correction process. FIG. 4 is a block diagram of an example of the configuration of the control unit 300. As illustrated therein, the control unit 300 includes a central processing unit (CPU) 310 that forms a main body of the control unit 300; a random access memory (RAM) 320 that provides a memory area used for various data processes performed by the CPU 310; a display unit 330 having a liquid crystal display and the like, for displaying an operation screen, a selection screen or the like; an input/output unit 340 capable of performing various data inputs such as an input or edition of a process recipe by an operator, and various data outputs such as an output of a process recipe or a process log to a specific storage medium; a notification unit 350 having an alarming device (for example, a buzzer) for notifying the operator of any abnormalities occurring in the heat treatment apparatus 100; and a unit controller 360 that controls each unit of the heat treatment apparatus 100 in response to instructions from the CPU 310.

The unit controller 360 includes a control device for controlling the flow rate controller to send a control signal (such as a flow rate set instruction, a zero point set instruction and the like) to the flow rate controller (such as each MFC 240) in response to the instruction from the CPU 310. The set flow rate of the MFC 240 is set to be a level that falls within a range from 0% to 100% by the set voltage of range from 0 to 5V (FS: Full Scale).

The control unit 300 further includes a program data storage unit 370 for storing a process program to perform each process of the heat treatment apparatus 100; and a process data storage unit 380 for storing required information (data) for running the process program. The program data storage unit 370 and the process data storage unit 380 are built in the memory area such as a hard disk drive (HDD). If necessary, the CPU 310 reads out a required program or data from the program data storage unit 370 and the process data storage unit 380, to perform each process program.

The program data storage unit 370 includes, for example, a process program 371 and a flow rate correction program 372. The process program 371 performs the process on the wafer W, and the flow rate correction program 372 performs the process of correcting the flow rate of gas that is introduced to the reaction tube 112. The process program 371 performs the process such as the heat treatment process on the wafer W by controlling each unit based on, e.g., the process recipe that includes the flow rate or pressure of gas and the like which are stored as process data 381 that will be described later, and by introducing the gas to the reaction tube 112.

The flow rate correction program 372 mainly has a first zero point shift detection program 373, a first zero point shift correction program 374, a second zero point shift detection program 375, and a second zero point shift correction program 376. The first zero point shift detection program 373 detects the amount of the zero point shift due to the use of the MFC 240 (the amount of the first zero point shift), and stores same. The first zero point shift correction program 374 performs the correction on the first zero point shift, based on the amount of the first zero point shift. The second zero point shift detection program 375 detects the amount of the zero point shift due to the installation arrangement of the MFC 240 (the amount of the second zero point shift), and stores same. The second zero point shift correction program 376 performs the correction on the second zero point shift, based on the amount of the second zero point shift.

The first zero point shift detection program 373, the first zero point shift correction program 374, the second zero point shift detection program 375, and the second zero point shift correction program 376 may be configured, for example, as subroutines of the flow rate correction program; or these may be configured as individual programs. Further, it is possible to configure the flow rate correction program 372 such that the first zero point shift detection program 373, the first zero point shift correction program 374, and the second zero point shift correction program 376 are run when the flow rate of gas is set for the MFC 240 by the process program 371.

The process data storage unit 380 includes, for example, process data 381 and flow rate correction data 382. The process data 381 stores necessary information for performing the process on the wafer. The flow rate correction data 382 includes necessary data for performing the flow rate correction process for the gas to be introduced into the reaction tube 112. The process data 381 stores the process recipe (including, for example, the flow rate and pressure of gas) of the wafer process.

The flow rate correction data 382 includes first zero point shift data 383 and second zero point shift data 384. The first zero point shift data 383 stores the amount of the first zero point shift due to the use of the MFC 240. The second zero point shift data 384 stores the amount of the second zero point shift due to the installation arrangement of the MFC 240.

Example of First Zero Point Shift Data

An example of the first zero point shift data 383 will be described with reference to FIG. 5, which illustrates an example of data table for the first zero point shift data 383. The first zero point shift data 383 includes such items as, for example, MFC(k) and amount (Ek) of the first zero point shift.

The item of MFC(k) stores the kind of MFC which is used for detecting and correcting the first zero point shift, wherein the character "k" specifies the MFC. The item of the amount (Ek) of the first zero point shift stores the amount of the first zero point shift obtained by an accumulated amount of the first zero point shift detected by the first zero point shift detection process that will be described later.

Further, if the MFC for detecting and correcting the first zero point shift is plural in number, the first zero point shift data 383 stores the amount (Ek) of the first zero point shift for each of the MFCs. If, for example, the heat treatment apparatus 100 configured as shown in FIG. 1 includes a first MFC 240A, a second MFC 240B and a third MFC 240C, the first zero point shift data 383 stores amounts E1, E2 and E3 of the first zero point shifts for the MFC 240A, 240B and 240C. Further, the items of the first zero point shift data 383 are not limited to those shown in FIG. 5.

Since an amount of the first zero point shift is increased in proportion to the time of using the MFC 240 as described above, the item of, for example, the amount (Ek) of the first zero point shift stores an accumulated amount of the first zero point shift. Whenever the amount of the first zero point shift is detected, the accumulated value is updated and then stored. To be specific, the accumulated amount is obtained by adding every amount of the first zero point shift that is newly detected to a previously accumulated amount of the first zero point shift. The accumulated amount of the first zero point shift is used for, for example, determining whether any abnormality has occurred to the MFCs 240A, 240B and 240C. If, for example, the accumulated amount of the first zero point shift is greater than a specific threshold, it is determined that an abnormality has occurred, and a notifying process therefor is performed.

Example of Second Zero Point Shift Data

An example of the second zero point shift data 384 will be described with reference to FIG. 6, which illustrates an example of a data table for the second zero point shift data 384. The second zero point shift data 384 includes items such as MFC(k), kind of gas (Gk), pressure (Pk), and amount (Vk) of the second zero point shift.

The item of MFC(k) stores the kind of MFC which detects and corrects the second zero point shift, wherein the character "k" specifies the MFC. The item of kind of gas (Gk) stores processing gases (gases used for the wafer process) whose flow rates are to be controlled by the MFC. The item of pressure (Pk) stores processing pressures (pressures during the wafer process) of the processing gases whose flow rates are to be controlled by the MFC. The item of amount (Vk) of the second zero point shift stores amounts of the second zero point shift detected in a second zero point shift detection process that will be described later.

Further, if the MFC for detecting and correcting the second zero point shift is plural in number, the second zero point shift data 384 stores the kind of gas (Gk), the pressure (Pk) and the amount (Ek) of the second zero point shift for each MFC. If, for example, the heat treatment apparatus 100 with the configuration shown in FIG. 1 includes the first MFC 240A, the second MFC 240B and the third MFC 240C, the second zero point shift data 384 stores amounts V1, V2 and V3 of the second zero point shifts for the MFC 240A, 240B and 240C, respectively, in a manner similar to the first zero point shift data 383. Further, the items of the second zero point shift data 384 are not limited to those shown in FIG. 6.

As described above, the amount of the second zero point shift is a characteristic value depending on the installation arrangement of the MFC 240, the kind (molecular weight) of the processing gas and the processing pressure. Therefore, the item of the amount (Vk) of the second zero point shift stores, for example, a value detected in the second zero point shift detection process when the heat treatment apparatus 100 is first installed in the factory. Further, it is preferable that the item of the amount (Vk) of the second zero point shift stores the value detected in the second zero point shift detection process whenever, for example, the kind of the processing gas or the processing pressure is changed.

The characteristic value of the amount of the second zero point shift is used for executing instructions for setting set flow rates of the MFC 240A, 240B and 240C when the gases is introduced into the reaction tube 112. Specifically, the set flow rate stored in the process recipe of the process data 381 is corrected by the amount of the second zero point shift, and thus corrected flow rate is set as the set flow rate. In this manner, the amount of the second zero point shift is prevented from affecting the actual flow rate of the gas supplied to the heat treatment unit 110.

Specific Example of Flow Rate Correction Process

Figure 7:
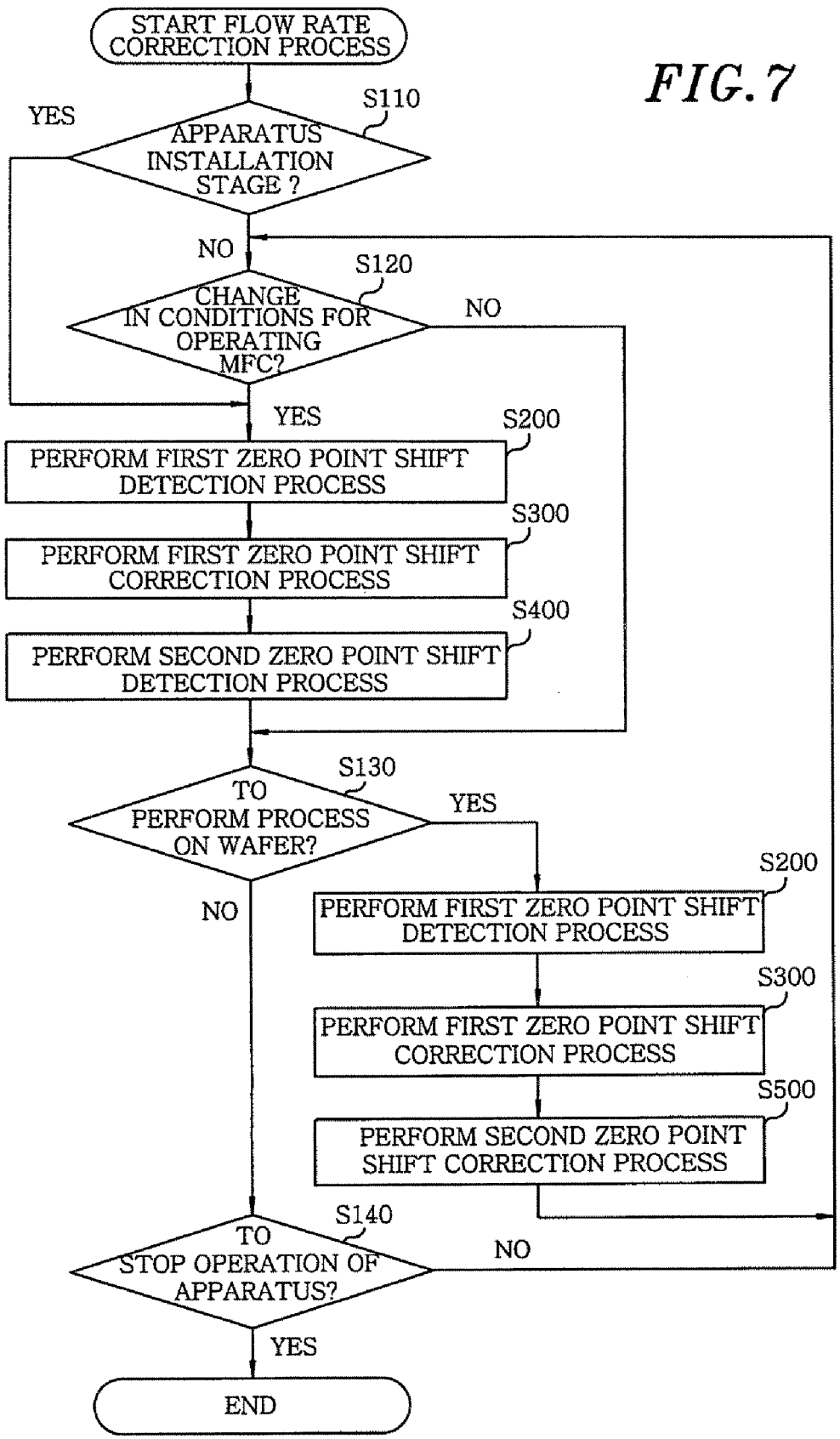
FIG. 7 is a flow chart of a flow rate correction process.

Hereinafter, an example of a flow rate correction process in a case of controlling the flow rate by the MFC will be described. FIG. 7 is a flow chart for explaining a main part of the flow rate correction process in the first embodiment. The flow rate correction process in the first embodiment corrects the deviation between the set flow rate and the actual flow rate, which is caused by both of the first zero point shift due to the use of the MFC and the second zero point shift due to the installation arrangement of the MFC. The flow rate correction process is performed in each of the MFCs 240A, 240B and 240C, pursuant to the flow rate correction program 372. Hereinafter, all the elements of the gas supply system 200 shown in FIG. 2 will be described by omitting characters "A", "B" and "C" from the reference symbols therefor. Therefore, for example, "MFC 240" represents each of the MFCs 240A, 240B and 240C.

As shown in FIG. 7, in the flow rate correction process in accordance with the first embodiment, when the heat treatment apparatus 100 is started, it is determined in step S110 whether or not it is an apparatus installation stage in which the heat treatment apparatus 100 is first installed in the factory. If it is determined, in the step S110, to be the apparatus installation stage of the heat treatment apparatus 100, the zero point shift detection process is performed. More particularly, the first zero point shift detection process (step S200), the first zero point shift correction process (step S300) and the second zero point shift detection process (step S400) are performed.

The reason why the first zero point shift detection process of the step S200 and the first zero point shift correction process of the step S300 are performed prior to the second zero point shift detection process of the step S400 is to detect the amount of only the second zero point shift. That is, even though the first zero point shift occurred, the second zero point shift can be detected in a state where the first zero point shift has been already corrected to be a zero flow rate. In this manner, the second zero point shift can be accurately detected.

However, when it is determined, in the step S110, not to be the apparatus installation stage of the heat treatment apparatus 100, it is further determined in step S120 whether or not any change has occurred in conditions for operating the MFC. Herein, the change in the conditions for operating the MFC refers to only such a change that makes it impossible to use a previously stored amount of the second zero point shift in the second zero point shift data 384 for the second zero point shift correction process. The change may be, for example, a change of the kind of processing gas, a change in the processing pressure, or a change of the MFC. If it is determined, in the step S120, that the change has occurred in the conditions for operating the MFC, the second zero point shift is newly detected, based on the changed conditions for operating the MFC, by performing the processes in steps S200 to S400; and the detected second zero point shift is stored in the second zero point shift data 384.

If it is determined, in the step S120, that no change has occurred in the conditions for operating the MFC, it is determined in step S130 whether or not to perform the wafer process. The purpose of this is to, whenever the wafer process is performed, correct the first zero point shift and the second zero point shift prior to the wafer process. If it is determined in the step 130 that the wafer process is to be performed, the zero point shift correction process is performed; more particularly, the first zero point shift detection process (step S200), the first zero point shift correction process (step S300) and the second zero point shift correction process (step S500) are performed, then the procedure returns to the process of the step S120.

The reason why the first zero point shift detection process (step S200) and the first zero point shift correction process (step S300) are performed prior to the second zero point shift correction process (step S500) is to correct only the amount of the second zero point shift. That is, even though the first zero point shift occurred, the second zero point shift can be corrected in a state where the first zero point shift has been corrected to be a zero flow rate. In this manner, the second zero point shift is corrected without being affected by the first zero point shift, so that the second zero point shift can be accurately corrected.

If it is determined, in the step S130, not to perform the wafer process, it is further determined in step S140 whether or not to stop the operation of the heat treatment apparatus 100. If it is determined to stop the operation of the heat treatment apparatus 100, the procedure returns to the process of the step S120; and if otherwise, the flow rate correction process is terminated.

The first zero point shift detection process (step S200), the first zero point shift correction process (step S300), the second zero point shift detection process (step S400) and the second zero point shift correction process (step S500) as shown in FIG. 7 are performed pursuant to the first zero point shift detection process program 373, the first zero point shift correction program 374, the second zero point shift detection program 375 and the second zero point shift correction program 376, respectively.

Further, since the first zero point shift detection process (step S200) and the first zero point shift correction process (step S300) serve as a prior process of the second zero point shift detection process (step S400), the first zero point shift detection process (step S200), the first zero point shift correction process (step S300) and the second zero point shift detection process (step S400) may be regarded as a series of the second zero point shift detection process. Likewise, since the first zero point shift detection process (step S200) and the first zero point shift correction process (step S300) serve as a prior process of the second zero point shift correction process (step S500), the first zero point shift detection process (step S200), the first zero point shift correction process (step S300) and the second zero point shift correction process (step S500) may be regarded as a series of the second zero point shift correction process.

Further, in performing the second zero point shift detection process (step S400) or the second zero point shift correction process (step S500), if the first zero point shift is corrected by other methods, there is no need to perform the first zero point shift detection process (step S200) and the first zero point shift correction process (step S300) as the prior process.

Further, the example of the flow rate correction process shown in FIG. 7 has been described as to a case where the first zero point shift detection process (step S200), the first zero point shift correction process (step S300) and the second zero point shift correction process (step S500) are performed whenever the wafer process is performed. However, the flow rate correction process is not limited thereto, and may be performed whenever, e.g., a specific time elapses. The processes in the steps S300 to S500 in FIG. 7 will be described in detail below.

Example of First Zero Point Shift Detection Process

Figure 8:
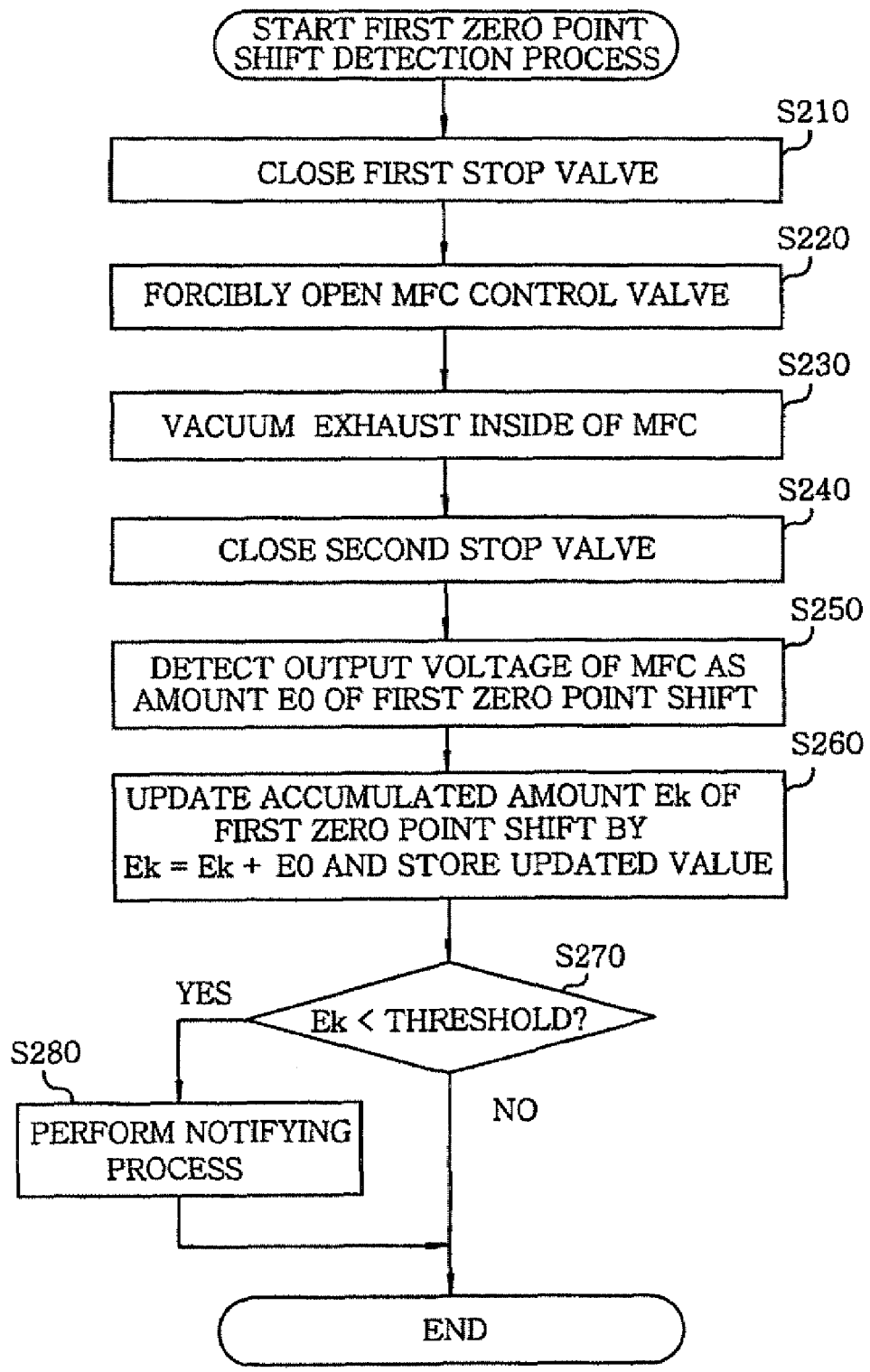
FIG. 8 is a flow chart of a first zero point shift detection process.

An example of the first zero point shift detection process (step S200) will be described with reference to a subroutine illustrated in FIG. 8. As illustrated therein, the control unit 300 renders the inside of the MFC 240 into a vacuum state in steps S210 to S240. To be specific, the first stop valve (upstream stop valve) 230 is closed in step S210, and the control valve 246 of the MFC 240 is forcibly opened in step S220. Then, a vacuum exhausting process is performed in the MFC 240 in step S230. The vacuum exhausting process is, for example, performed by the vacuum exhaust unit 124 through the bypass line 130 by opening the exhaust-side bypass stop valve 134 and the supply-side bypass stop valve 136. Subsequently, in step S240, the second stop valve (downstream stop valve) 250 is closed.

Since the inside of the MFC 240 is at the vacuum level with no fluid that can flow in step S210 to S240, the second zero point shift due to the thermal siphon effect does not occur.

In this case, if the inside of the MFC 240 is not vacuum exhausted, a flow of fluid may be generated by the thermal siphon effect as long as any fluid exists therein, even while the first stop valve (upstream stop valve) 230 and the second stop valve (downstream stop valve) 250 are closed. Therefore, if the MFC output voltage is detected in this state, the MFC output voltage is determined by not only the amount of the first zero point shift but also the amount of the second zero point shift. If this is the case, the first zero point shift cannot be accurately detected.

In this regard, in accordance with the first embodiment, the MFC output voltage is detected from step S250 after the inside of the MFC 240 is rendered into the vacuum state in which the second zero point shift does not occur. Therefore, the amount of the first zero point shift can be detected in a state without the second zero point shift. In this manner, the amount of the first zero point shift can be accurately detected.

In this state, it is to wait until the MFC output voltage is stabilized. After the MFC output voltage is stabilized, the MFC output voltage is detected in step S250 by measuring the amount E0 of the present first zero point shift. Specifically, a flow rate detection instruction is transmitted to the MFC control circuit 247, and the MFC output voltage is obtained. In this case, if the first zero point shift does not occur, the MFC output voltage is zero; and if otherwise, the MFC output voltage is not zero.

Subsequently, in step S260, the accumulated amount of the first zero point shift acquired up to the previous time is updated by computing Ek=Ek+E0, and then is stored. That is, an amount E0 of the present first zero point shift is added to an amount Ek of the first zero point shift accumulated up to the previous time that is stored in the first zero point shift data 383, and the added amount is stored as a new amount Ek of the first zero point shift. In the first zero point shift data 383 of FIG. 5, for example, if the amount of the first zero point shift of the first MFC 240A accumulated up to the previous time is equal to E1, the amount E1 of the first zero point shift is updated by computing E1=E1+E0, and then is stored.

Subsequently, it is determined in step S270 whether or not the amount Ek of the first zero point shift updated as described above is greater than a threshold. If it is determined that the updated amount Ek of the first zero point shift is greater than the threshold, the notifying process is performed in step S280. In the notifying process, for example, a warning sound is generated by the notification unit 350 such as an alarm or the like, or a warning display is shown on the display unit 330 such as a liquid crystal panel or the like. Therefore, a malfunction in the MFC 240 or a time to replace the MFC 240 can be informed. The threshold is, for example, ±0.3 V (+300 mV), a deviation limit from a reference voltage. If the accumulated amount Ek of the first zero point shift is greater than the threshold, the notifying process is performed. In this case, the MFC 240 is considered as having a failure. If, in the step S270, it is determined that the accumulated amount Ek of the first zero point shift is not greater than the threshold, the first zero point shift detection process is terminated.

Further, in case of performing the first zero point shift detection process, a preparatory check process may be performed in advance, so that the first zero point shift of the MFC 240 can be exactly detected. The followings are examples of the preparatory check process: a warming-up operation for a specific amount of time (e.g., more than four hours) after powering on of the semiconductor fabrication apparatus; a normal exhaustion (e.g., more than two hours) of a container (gas box) that contains the gas supply system 200; a waiting process for a temperature stabilization in case of adjusting a temperature by a heater; and a leakage check of the first stop valve (the upstream stop valve) 230 and the second stop valve (the downstream stop valve) 250. It is preferable that the first zero point shift detection process is performed after verifying, in the preparatory check process, that no abnormality has occurred.

Example of First Zero Point Shift Correction Process

Figure 9:
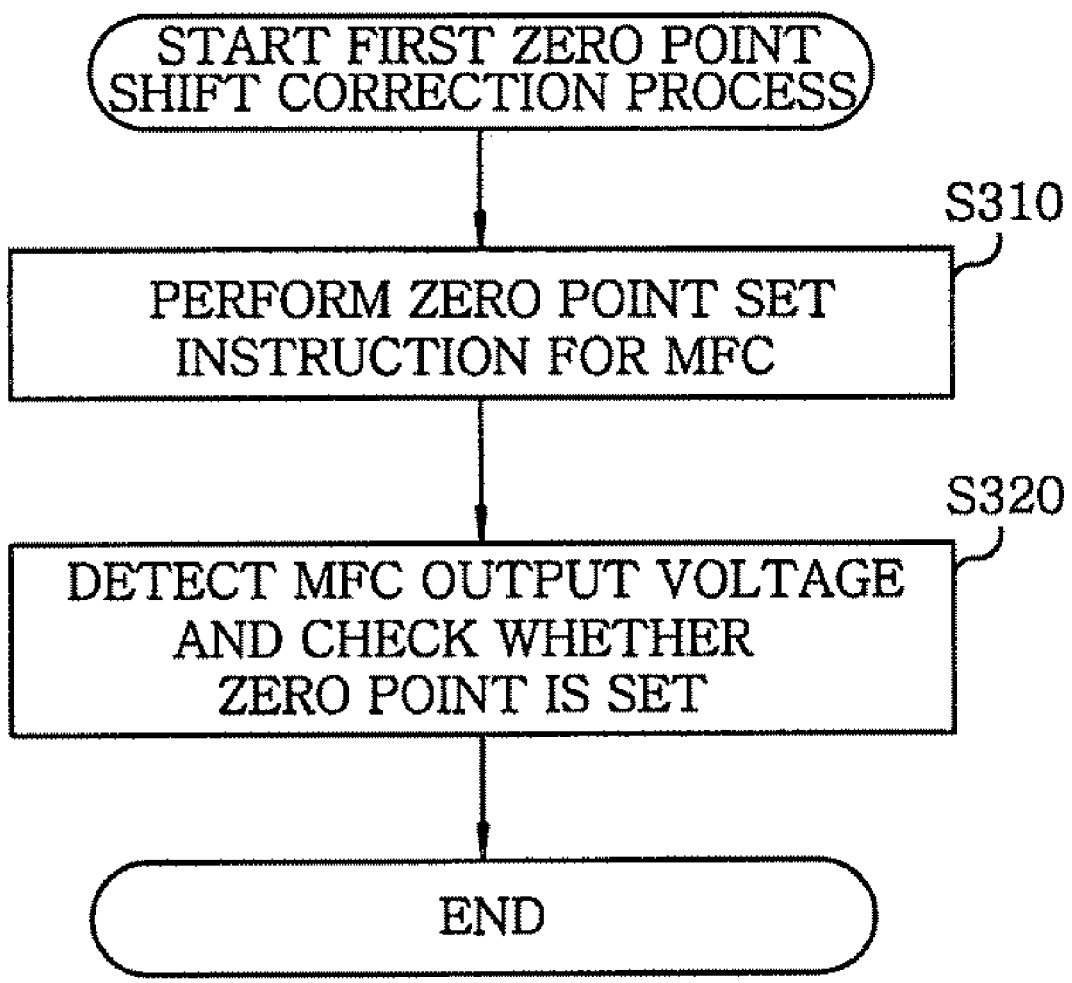
FIG. 9 is a flow chart of a first zero point shift correction process.

An example of the first zero point shift correction process (step S300) will be described with reference to a subroutine shown in FIG. 9. As illustrated therein, the control unit 300 performs, in step S310, the zero point set instruction of the MFC 240. Specifically, the control unit 300 transmits the zero point set instruction to the MFC 240, and sets the present state as a flow rate zero. If, for example, the amount Ek of the first zero point shift detected in a vacuum state without any fluid in MFC 240 is not zero in step S200, that state is set as the flow rate zero.

Subsequently, in step S320, the MFC output voltage is detected, and it is checked whether or not the zero point has been set. That is, it is checked whether or not the MFC output voltage is zero. When the first zero point shift correction process is completed, the procedure returns to that shown in FIG. 7 and subsequently performs the second zero point shift detection process (step S400), and thereafter, the first zero point shift correction process is terminated.

Example of Second Zero Point Shift Detection Process

Figure 10:
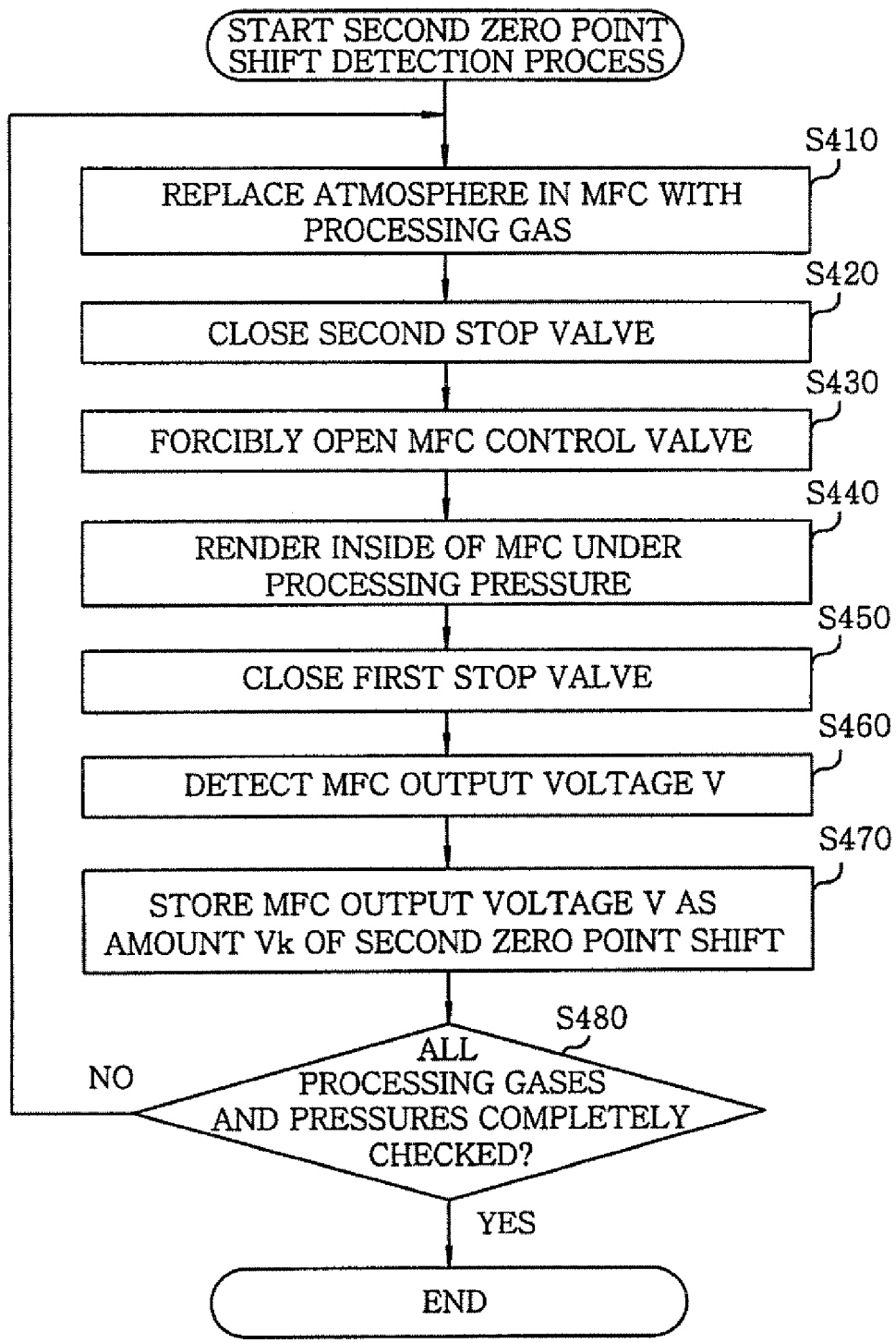
FIG. 10 is a flow chart of a second zero point shift detection process.

An example of the second zero point shift detection process (step S400) will be described with reference to a subroutine illustrated in FIG. 10. As illustrated therein, the control unit 300, in step S410, replaces an atmosphere in the MFC 240 with a processing gas (for example, $SiH_4$ for the MFC 240A). Specifically, for example, the processing gas is introduced into the MFC 240 by opening the first stop valve (upstream stop valve) 230 and the second stop valve (downstream stop valve) 250. At the same time, a vacuum exhausting process is performed by the vacuum exhaust unit 124 through the bypass line 130 by opening the exhaust-side bypass stop valve 134 and the supply-side bypass stop valve 136. In this case, the atmosphere in the MFC 240 may be replaced by the processing gas by a cycle purge in which a processing gas introducing process and a vacuum exhausting process is alternately repeated.

Subsequently, after being introduced into the MFC 240, the processing gas is isolated within the MFC 240 under the processing pressure in steps S420 to S440. More particularly, in step S420, the second stop valve (downstream stop valve) 250 is closed; in step S430, the control valve 246 of the MFC 240 is forcibly opened; and in step S440, the processing pressure is applied to the inside of the MFC 240. Specifically, the processing gas is introduced until an internal pressure of the MFC 240 becomes equal to the processing pressure while the second stop valve (downstream stop valve) 250 is closed. Further, when the internal pressure of the MFC 240 becomes equal to the processing pressure, the first stop valve (upstream stop valve) 230 is closed in step S450, and the introduction of the processing gas is stopped. Thus, the processing gas is isolated within the MFC 240 under the processing pressure.

In this state, it is to wait until the MFC output voltage is stabilized. After the MFC output voltage is stabilized, the MFC output voltage V is detected in step S460. Specifically, the flow rate detection instruction is sent to the MFC control circuit 247, and the MFC output voltage is obtained by measuring an amount V of the second zero point shift. Here, if the second zero point shift does not occur, the MFC output voltage is zero; and if otherwise, the MFC output voltage is not zero. Further, in the present embodiment, since the detection of the first zero point shift (step S200) and the correction of the first zero point shift (step S300) have already been performed, the amount of the second zero point shift can be detected without being affected by the amount of the first zero point shift. Thus, the amount of the second zero point shift is accurately detected.

Next, in step S470, the amount V of the second zero point shift is stored as it is. That is, the amount V of the second zero point shift is stored as the item of the amount Vk of the second zero point shift in the second zero point shift data 384. For example, in the second zero point shift data 384 shown in FIG. 6, the amount V of the second zero point shift detected for $SiH_4$ gas of the first MFC 240A is stored as an amount $V1_{SiH4}$ of the second zero point shift.

Next, it is determined in step S480 whether or not all of the processing gases and the processing pressures have been completely checked. As described above, the amount of the second zero point shift varies depending on the kind (molecular weight) of gas and the pressure thereof. Therefore, when a plurality of processing gases and processing pressures are applied in a single MFC, the second zero point shift has to be individually detected under each processing pressure for each processing gas.

For example, in the configuration shown in FIG. 1, the processing gases of the first MFC 240 are $SiH_4$ and $N_2$. Therefore, the second zero point shift is detected for each processing gas. Herein, if a plurality of processing pressures are applied to a single kind of gas, the second zero point shift is detected for each processing gas.

If, in the step S480, it is determined that all of the processing gases and the processing pressures are not yet completely checked, the procedure returns to the step S410. However, if it is determined that the checks of all processing gases and pressures are completed, the second zero point shift detection process is terminated.

Further, when performing the second zero point shift detection process, as in the above-described first zero point shift detection process, a preparatory check process may be performed in advance to accurately detect the second zero point shift of the MFC 240. Examples of this preparatory check process are same as those of the first zero point shift detection process.

Example of Second Zero Point Shift Correction Process

Figure 11:
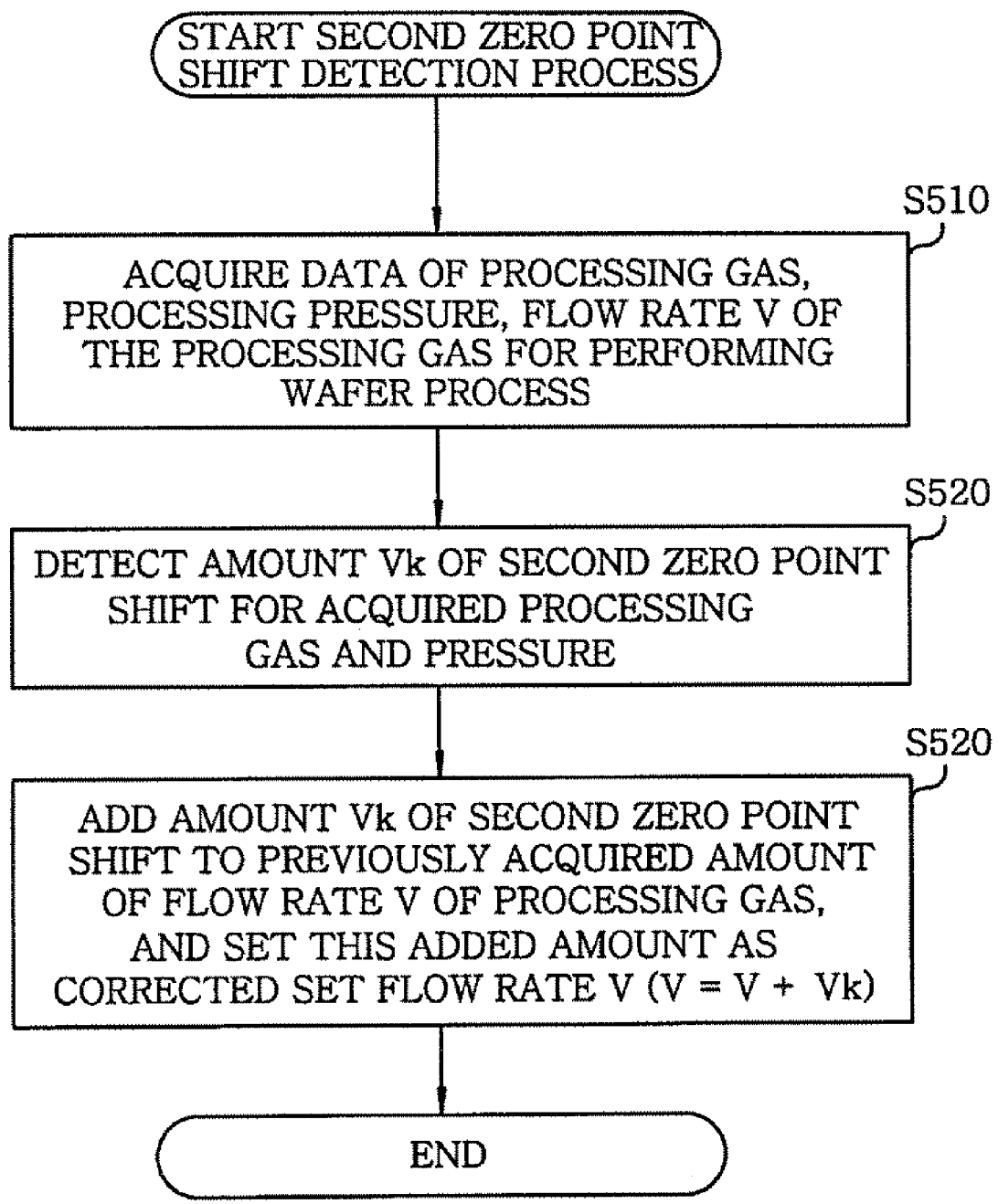
FIG. 11 is a flow chart of a second zero point shift correction process.

An example of the second zero point shift correction process (step S500) will be described with reference to a subroutine shown in FIG. 11. As shown therein, in step S510, the control unit 300 acquires data on the processing gas, the processing pressure, the flow rate V of the processing gas for performing the wafer process, based on, e.g., the process data 381 of the process data storage unit 380. Further, the data on the processing gas, the processing pressure and the flow rate V of the processing gas may be inputted by an operator who operates the input/output unit 340 such as a touch panel and the like.

Subsequently, in step S520, the amount of the second zero point shift for the processing gas and pressure is detected based on the second zero point shift data 394 of the process data storage unit 380. In this case, if the flow rate of the gas is controlled by a plurality of the MFCs 240 during the wafer process, the second zero point shift data 394 is acquired for each of the MFCs 240.

Next, in step S530, the amount Vk of the second zero point shift is added to the previously acquired amount of the flow rate V of the processing gas, and this added amount is set as a corrected set flow rate V in the MFC 240 (V=V+Vk). Specifically, the control unit 300 sends a flow rate set instruction to the MFC control circuit 247 of the MFC 240. Then, the MFC control circuit 247 sets the flow rate to be the corrected flow rate V that reflects the correction of the second zero point shift.

Therefore, during the wafer process, the flow rate is adjusted to be the flow rate V that reflects the correction of the first zero point shift as well as that of the second zero point shift. Thus, the flow rate is controlled with a higher accuracy, without being affected by the first zero point shift and the second zero point shift of the MFC 240.

Further, in the flow rate correction process shown in FIG. 7, in case of performing the wafer process, the amount of the first zero point shift is detected in the step S200, and is corrected in the step S300. After these steps, in step S500, the amount of the second zero point shift is corrected. However, the flow rate correction process is not limited to that shown in FIG. 7. The amount of the first zero point shift and the amount of the second zero point shift may be corrected simultaneously.

More particularly, it is also possible to correct the set voltage that corresponds to the flow rate of each gas used for the wafer process, based on the amount of the second zero point shift stored in the second zero point shift data 384 and the amount of the first zero point shift detected when performing the wafer process. The set voltage of the corrected flow rate of gas may be set in the MFC 240. Further, the first zero point shift correction process (step S300) may be skipped by not performing the instruction to set the zero point. In this case, the second zero point shift correction process (step S500) may be performed by considering the correction of the amount of the first zero point shift. For example, the flow rate (V=V+Vk+E) is obtained by adding the amount Vk of the second zero point shift plus the previously detected amount E of the first zero point shift to the flow rate V of the processing gas acquired in step S530, and is set as the corrected set flow rate V in the MFC 240. In this manner, the amount of the first zero point shift and that of the second zero point shift are corrected simultaneously.

In the heat treatment apparatus 100 of the above-described configuration in accordance with the first embodiment, the amount of the zero point shift (the second zero point shift) due to the thermal siphon effect which may occur when the wafer process is actually performed can be accurately detected. That is, since the amount of the zero point shift due to the thermal siphon effect varies depending on the kind (molecular weight) of gas, the amount of the zero point shift which may occur when the wafer process is actually performed can be accurately detected by detecting the amount of the zero point shift (the second zero point shift) due to the thermal siphon effect by using gases used for the wafer process.

Further, after the amount of the zero point shift (the second zero point shift) due to the thermal siphon effect is detected and stored, the amount of the second zero point shift can be exactly corrected by correcting the set voltage corresponding to the flow rate of the gas used when the waver process is performed. Accordingly, the accuracy in controlling the flow rate is further improved, regardless of the installation arrangement of the MFC 240. Furthermore, the amount of the zero point shift due to the thermal siphon effect can be accurately detected and corrected without depending on the configuration of the MFC 240.

Furthermore, since the above-described flow rate correction process is performed for each of the MFCs 240A, 240B and 240C included in the heat treatment apparatus 100 in accordance with the first embodiment, the accuracy in controlling the flow rate can be further improved without depending on the installation arrangement of each of the MFCs 240A, 240B and 240C.

Further, since the amount of the first zero point shift due to the use of the MFC 240 is detected and corrected before the amount of the second zero point shift due to the thermal siphon effect is detected, the amount of the second zero point shift due to the thermal siphon effect can be accurately detected without being affected by the first zero point shift. Furthermore, to detect the amount of the first zero point shift, each of the stop valves 230 and 250 of the MFC 240 is closed so that no actual gas flows, and the inside of the MFC 240 is vacuum exhausted so that no fluid that generates a flow exists therein. Consequently, since no thermal siphon effect occurs, the amount of the first zero point shift can be detected in a state where no second zero point shift occurs. Accordingly, the amount of the first zero point can be accurately detected.

Furthermore, in performing the wafer process, the amount of the first zero point shift due to the use of MFC 240 is detected and corrected before the amount of the second zero point shift due to the thermal siphon effect is corrected. Therefore, the amount of the second zero point shift due to the thermal siphon effect is accurately corrected without being affected by the first zero point shift. Accordingly, the accuracy in controlling the flow rate is further improved, regardless of the installation arrangement of the MFC 240.

Figure 12:
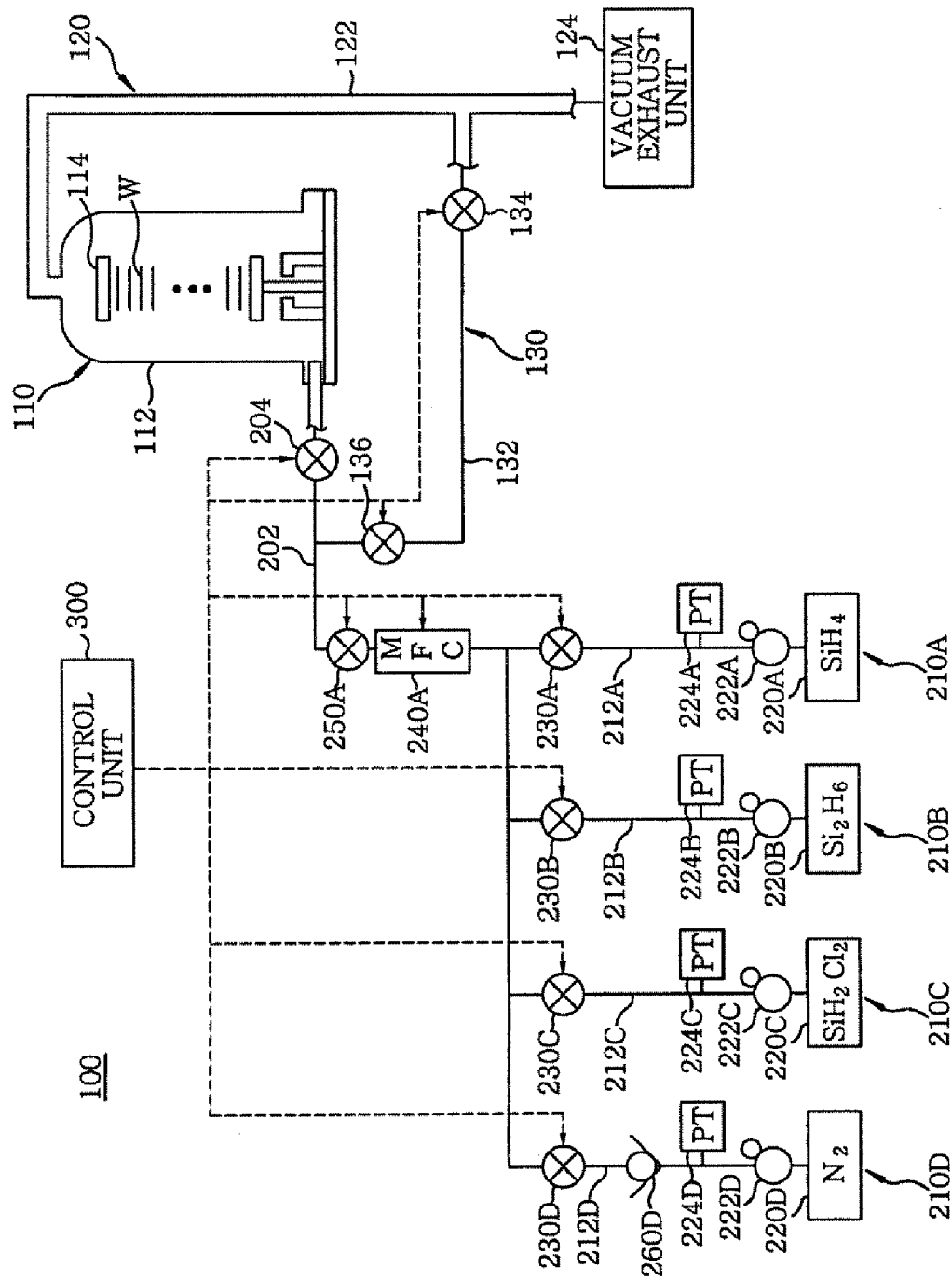
FIG. 12 is a block diagram of an example of the configuration of a semiconductor fabrication apparatus in accordance with a second embodiment of the present invention.

Example of Configuration of Semiconductor Fabrication Apparatus of Second Embodiment A semiconductor fabrication apparatus in accordance with a second embodiment of the present invention will be described with reference to the drawings. Like the above description of the first embodiment, a heat treatment apparatus for performing a specific heat treatment on a wafer will be described as an example of the semiconductor fabrication apparatus in accordance with the second embodiment. FIG. 12 illustrates an example of the configuration of the heat treatment apparatus 100 in accordance with the second embodiment. The heat treatment apparatus 100 in accordance with the second embodiment is different from the heat treatment apparatus in accordance with the first embodiment in the configuration of the gas supply system 200. Specifically, in the heat treatment apparatus 100 in accordance with the first embodiment, the first, second and third MFCs 240A, 240B and 240C are configured to control respective flow rates of the processing gases, $SiH_4$ gas, $Si_2H_6$ gas and $SiH_2Cl_2$ gas. But in the heat treatment apparatus 100 in accordance with the second embodiment, one common first MFC 240A is configured to control the flow rate of the processing gases, $SiH_4$ gas, $Si_2H_6$ gas and $SiH_2Cl_2$ gas.

Specifically, gas supply passages 210A, 210B and 210C of $SiH_4$ gas, $Si_2H_6$ gas and $SiH_2Cl_2$ gas are merged at a downstream side of first stop valves (upstream stop valves) 230A, 230B and 230C, respectively; and are connected to an gas inlet of the MFC 240A. Further, for example, a gas supply passage 210D of $N_2$ gas used as a purge gas joins at the downstream side of the first stop valves (upstream stop valves) 230A, 230B and 230C through a check valve 260D, a first stop valve (upstream stop valve) 230D, and is connected to the gas inlet of the MFC 240A.

As shown in FIG. 13, in the second embodiment, the first zero point shift data 383 needs only to store the amount Ek of the first zero point shift of the MFC 240A. Further, as shown in FIG. 14, in the second embodiment, the second zero point shift data 384 only stores the kind of gas (Gk), the pressure (Pk) and the amount (Vk) of the second zero point shift of the MFC 240A.

The flow rate correction process as shown in FIGS. 7 to 11 may be applied to the heat treatment apparatus 100 in accordance with the second embodiment, in a manner similar to the heat treatment apparatus 100 in accordance with the first embodiment. For example, in the heat treatment apparatus 100 shown in FIG. 12, one common MFC 240A controls the flow rates of a plurality of processing gases ($SiH_4$ gas, $Si_2H_6$ gas, $SiH_2Cl_2$ gas and $N_2$ gas). Therefore, in the second zero point shift detection process (step S400) in accordance with the second embodiment, the amount of the second zero point shift is detected with respect to each processing gas, and the amount of the second zero point shift of each processing gas is pre-stored in the second zero point shift data 384 as shown in FIG. 14.

Further, when performing the wafer process, after the first zero point shift detection process (step S200) and the first zero point shift correction process (step S300) are performed, a set flow rate of each processing gas is corrected by the second zero point shift correction process (step S500), based on the second zero point shift data 384. Thus, during the wafer process, the flow rate is controlled by the flow rate V that reflects the correction of the second zero point shift as well as that of the first zero point shift.

In accordance with the heat treatment apparatus 100 in accordance with the second embodiment, plural kinds of gases are supplied to the heat treatment unit 110 by using the common MFC 240A to thereby perform the wafer process. In this case, the amount of the zero point shift due to the thermal siphon effect, which may actually occur when each gas is used for the wafer process, is accurately detected and properly corrected by performing the flow rate correction process same as that of the first embodiment. Accordingly, the accuracy in controlling the flow rate can be further improved regardless of the installation arrangement of the MFC 240A.

Further, the present invention described with reference to the above embodiments may be applied to a system with a plurality of devices, or to an apparatus with one device. A medium, such as a storage medium that stores the program of software for implementing the functions in accordance with the above embodiments, is provided to the system or the apparatus. A computer (or CPU or MPU) of the system or the apparatus reads out the program stored in the medium such as the storage medium, and runs the program so that the present invention can be implemented.

In this case, the program read out from the medium such as the storage medium realizes the functions in accordance with the above embodiments; and the medium such as the storage medium that stores the program is included in the present invention. As the medium such as the storage medium for providing the program, the followings may be used: a floppy (registered trademark) disk, a hard disk, an optical disk, a magneto-optical disk, a CD-ROM, a CD-R, a CD-RW, a DVD-ROM, a DVD-RAM, a DVD-RW, a DVD+RW, a magnetic tape, a nonvolatile memory card, a ROM or the like; or the program may be downloaded through networks.

Further, the present invention includes not only a case where the performances of above embodiments are realized by running a computer-read program, but also a case where the performances of above embodiments are realized by performing a partial or entire part of actual processes by an OS operated in a computer, based on instructions of the program.

Furthermore, the present invention also includes a case where, after a program is read out from a medium such as a storage medium and then is stored in a memory in a function extension board inserted in a computer or in a function extension unit connected to the computer, the performances of the above embodiments are realized by performing a partial or entire part of actual processes by a CPU included in the function extension board or the function extension unit, based on instructions of the program.

In the above, embodiments of the present invention have been described with reference to the accompanying drawings. However, the present invention is not limited thereto, and it will be understood by those skilled in the art that various changes and modifications may be made without departing from the scope of the invention as defined in the following claims. In this case, the changes and the modifications should also be construed to fall within the scope of the present invention.

For example, although in the first and the second embodiment the heat treatment apparatus has been described as an example of the semiconductor fabrication apparatus, the present invention is not limited thereto. The present invention may also be applicable to various semiconductor fabrication apparatuses as long as they perform specific processes on a substrate by controlling the flow rate of gas or liquid with a flow rate controller such as a mass flow controller. For example, besides the heat treatment apparatus, the present invention may also be applied to an etching apparatus or a film forming apparatus.

The present invention can be applied to a semiconductor fabrication apparatus that controls a flow rate of gas or liquid with a flow rate controller such as a mass flow controller, and performs a specific process of a substrate; a method of correcting the flow rate in the semiconductor fabrication apparatus; and a program therefor.

What is claimed is:

1. A method of correcting a flow rate for a semiconductor fabrication apparatus that performs a substrate process on a substrate in a processing unit for manufacturing a semiconductor device by supplying a gas to the processing unit, by using a flow rate controller that compares an output voltage of a detection unit for detecting a gas flow rate of a gas supply passage with a set voltage that corresponds to a set flow rate set in advance, and controls the gas flow rate of the gas supply passage to be the set flow rate, the method comprising:
 a zero point shift detection step of, before the substrate process is performed, detecting an output voltage of the flow rate controller in a state where an atmosphere in the flow rate controller is replaced with a processing gas used for the substrate process and each of stop valves respectively installed in an upstream and a downstream side of the flow rate controller is closed, and storing the output voltage as a zero point shift in a storage unit; and
 a zero point shift correction step of, when the substrate process is performed, correcting the set voltage to correspond to a gas flow rate of the processing gas used for the substrate process based on the zero point shift of the flow rate controller stored in the storage unit, and setting the corrected set voltage in the flow rate controller.

2. A method of correcting a flow rate for a semiconductor fabrication apparatus that performs a substrate process on a substrate in a processing unit for manufacturing a semiconductor device by supplying plural kinds of gases to the processing unit, by using a plurality of flow rate controllers that compare output voltages of detection units for detecting gas flow rates of gas supply passages with set voltages that correspond to set flow rates set in advance, and controls the gas flow rates of the gas supply passages to be the set flow rates, the method comprising:
 a zero point shift detection step of, before the substrate process is performed, detecting output voltages of the flow rate controllers in a state where atmospheres in the flow rate controllers are replaced with processing gases used for the substrate process and each of stop valves respectively installed in upstream and downstream sides of the flow rate controllers is closed, and storing in a storage unit the output voltages as zero point shifts respectively for the processing gases; and
 a zero point shift correction step of, when the substrate process is performed, correcting the set voltages to correspond to gas flow rates of the processing gases used for the substrate process based on the zero point shifts of the flow rate controllers stored in the storage unit, and setting the corrected set voltages respectively in the flow rate controllers.

3. A method of correcting a flow rate for a semiconductor fabrication apparatus that performs a substrate process on a substrate in a processing unit for manufacturing a semiconductor device by supplying plural kinds of gases to the processing unit, by using a flow rate controller that compares output voltages of a detection unit for detecting gas flow rates of a gas supply passage with set voltages that correspond to set flow rates set in advance, and controls the gas flow rates of the gas supply passage to be the set flow rates, the method comprising:
 a zero point shift detection step of, before the substrate process is performed, detecting output voltages of the flow rate controller respectively for the processing gases in a state where an atmosphere in the flow rate controller is replaced with each of the processing gases used for the substrate process and each of stop valves respectively installed in an upstream and a downstream side of the flow rate controller is closed, and storing the output voltages as zero point shifts respectively for the processing gases in a storage unit; and
 a zero point shift correction step of, when the substrate process is performed, correcting the set voltages to correspond to gas flow rates of the processing gases used for the substrate process based on the zero point shifts of the flow rate controllers stored in the storage unit, and setting the corrected set voltages in the flow rate controller.

4. A method of correcting a flow rate for a semiconductor fabrication apparatus that performs a substrate process on a substrate in a processing unit for manufacturing a semiconductor device by supplying a gas to the processing unit, by using a flow rate controller that compares an output voltage of a detection unit for detecting a gas flow rate of a gas supply passage with a set voltage that corresponds to a set flow rate set in advance, and controls the gas flow rate of the gas supply passage to be the set flow rate, the method comprising:
 a second zero point shift detection step of, before the substrate process is performed, detecting an output voltage of the flow rate controller as a first zero point shift in a state where an inside of the flow rate controller is vacuum exhausted by a vacuum exhaust unit and each of stop valves is closed, performing a zero point correction based on the first zero point shift, subsequently detecting another output voltage of the flow rate controller in a state where an atmosphere in the flow rate controller is replaced at least with a processing gas used for the substrate process and each of the stop valves is closed, and storing said another output voltage as a second zero point shift in a storage unit; and
 a second zero point shift correction step of, when the substrate process is performed, detecting an output voltage of the flow rate controller as another first zero point shift in a state where the inside of the flow rate controller is vacuum exhausted by the vacuum exhaust unit and each of the stop valves is closed, performing the zero point correction based on said another first zero point shift, correcting the set voltage to correspond to a flow rate of the processing gas used for the substrate process based on the second zero point shift stored in the storage unit, setting the corrected set voltage in the flow rate controller.

5. A method of correcting a flow rate for a semiconductor fabrication apparatus that performs a substrate process on a substrate in a processing unit for manufacturing a semiconductor device by supplying a gas to the processing unit, by using a flow rate controller that compares an output voltage of a detection unit for detecting a gas flow rate of a gas supply passage with a set voltage that corresponds to a set flow rate set in advance, and controls the gas flow rate of the gas supply passage to be the set flow rate, the method comprising:
 a second zero point shift detection step of, before the substrate process is performed, detecting an output voltage of the flow rate controller as a first zero point shift in a state where an inside of the flow rate controller is vacuum exhausted by a vacuum exhaust unit and each of stop valves is closed, performing a zero point correction based on the first zero point shift, subsequently detecting another output voltage of the flow rate controller in a state where an atmosphere in the flow rate controller is replaced at least with a processing gas used for the substrate process and each of the stop valves is closed, and storing said another output voltage as a second zero point shift in a storage unit; and a second zero point shift correction step of, when the substrate process is performed, detecting an output voltage of the flow rate controller as another first zero point shift in a state where the inside of the flow rate controller is vacuum exhausted by the vacuum exhaust unit and each of the stop valves is closed, correcting the set voltage to correspond to a flow rate of the processing gas used for the substrate process based on the second zero point shift stored in the storage unit and said another first zero point shift detected when the substrate process is performed, setting the corrected set voltage in the flow rate controller.

6. The method of claim 4, wherein an accumulated amount of the first zero point shift is stored in the storage unit whenever the first zero point shift is detected, and wherein, when the first zero point shift is newly detected, if a sum of the newly detected first zero point shift and the accumulated amount of the first zero point shift acquired up to a previous time is greater than a threshold, a notifying process is performed.

* * * * *